US012052856B2

(12) United States Patent
Kang et al.

(10) Patent No.: US 12,052,856 B2
(45) Date of Patent: Jul. 30, 2024

(54) SEMICONDUCTOR DEVICE

(71) Applicant: SAMSUNG ELECTRONICS CO., LTD., Suwon-si (KR)

(72) Inventors: Jong In Kang, Hwaseong-si (KR); Jun Young Choi, Seoul (KR); Yoon Gi Hong, Seoul (KR); Tae Hoon Kim, Seoul (KR); Sung-Jin Yeo, Yongin-si (KR); Sang Yeon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 17/657,202

(22) Filed: Mar. 30, 2022

(65) Prior Publication Data

US 2023/0022373 A1 Jan. 26, 2023

(30) Foreign Application Priority Data

Jul. 20, 2021 (KR) .................... 10-2021-0094575

(51) Int. Cl.
*H01L 21/768* (2006.01)
*H01L 23/00* (2006.01)
(Continued)

(52) U.S. Cl.
CPC ........... *H10B 12/315* (2023.02); *H10B 12/34* (2023.02)

(58) Field of Classification Search
CPC ............................ H10B 12/315; H10B 12/34
See application file for complete search history.

(56) References Cited

U.S. PATENT DOCUMENTS

| D454,999 S | 3/2002 | Villafana |
| 7,915,121 B1 | 3/2011 | Kim |
| (Continued) | | |

FOREIGN PATENT DOCUMENTS

| CN | 104051338 | 9/2014 |
| CN | 108400130 | 8/2018 |
| (Continued) | | |

OTHER PUBLICATIONS

Partial European Search Report dated Nov. 25, 2022 in corresponding European Patent Application No. 22164909.8 (13 pages).
(Continued)

*Primary Examiner* — Antonio B Crite
*Assistant Examiner* — Tenley H Schofield
(74) *Attorney, Agent, or Firm* — F. CHAU & ASSOCIATES, LLC

(57) ABSTRACT

A semiconductor device is provided. The semiconductor device includes a substrate which includes a cell region and a core region, a boundary element separation film which is placed inside the substrate, and separates the cell region and the core region, and a bit line which is placed on the cell region and the boundary element separation film and extends along a first direction, in which the boundary element separation film includes a first region and a second region, a height of an upper side of the first region of the boundary element separation film is different from a height of an upper side of the second region of the boundary element separation film, on a basis of a bottom side of the boundary element separation film, and the bit line is placed over the first region and the second region of the boundary element separation film.

14 Claims, 27 Drawing Sheets

(51) Int. Cl.
    *H01L 23/31*     (2006.01)
    *H01L 23/495*    (2006.01)
    *H01L 23/522*    (2006.01)
    *H01L 23/528*    (2006.01)
    *H01L 23/532*    (2006.01)
    *H01L 25/065*    (2023.01)
    *H10B 12/00*     (2023.01)

(56) References Cited

U.S. PATENT DOCUMENTS

| | | | |
|---|---|---|---|
| 7,928,504 | B2 | 4/2011 | Choi |
| 8,445,350 | B2 | 5/2013 | Han |
| 8,809,993 | B2 | 8/2014 | Kwak et al. |
| 8,928,073 | B2 | 1/2015 | Jang et al. |
| 10,468,347 | B2 | 11/2019 | Kadoya |
| 10,541,302 | B2 | 1/2020 | Yoon et al. |
| 10,679,997 | B2 | 6/2020 | Jung et al. |
| 10,943,812 | B2 | 3/2021 | Jang et al. |
| 2004/0129998 | A1 | 7/2004 | Inoh et al. |
| 2012/0086084 | A1 | 4/2012 | Kikuchi |
| 2015/0179658 | A1* | 6/2015 | Lee .................. H01L 21/28008 438/588 |
| 2018/0166529 | A1* | 6/2018 | Park .................... H10B 12/033 |
| 2018/0175038 | A1* | 6/2018 | Lee .................. H01L 21/76224 |
| 2018/0350905 | A1* | 12/2018 | Yoon .................. H01L 29/0649 |
| 2020/0135850 | A1* | 4/2020 | Yoon ................. H01L 21/76232 |
| 2020/0312845 | A1 | 10/2020 | Yoon et al. |
| 2021/0098460 | A1 | 4/2021 | Lee et al. |

FOREIGN PATENT DOCUMENTS

| | | |
|---|---|---|
| KR | 10-1997-0076834 | 12/1997 |
| KR | 10-2011-0003039 | 1/2011 |
| KR | 10-2018-0060930 | 6/2018 |

OTHER PUBLICATIONS

Taiwan Office Action dated Nov. 10, 2022 for corresponding Taiwan Patent Application No. 111121544 (4 pages), in Chinese.

Office Action dated Feb. 8, 2023 in corresponding Indian Patent Application No. 202244021949 (7 pages).

Office Action dated Mar. 28, 2023 in European Patent Application No. 22164909.8 (9 pages).

European Search Report dated Mar. 15, 2023 in corresponding European Patent Application No. 22164909.8 (6 pages).

* cited by examiner

SEMICONDUCTOR DEVICE

CROSS-REFERENCE TO RELATED APPLICATION

This application claims priority under 35 U.S.C. § 119 to Korean Patent Application No. 10-2021-0094575, filed on Jul. 20, 2021, in the Korean Intellectual Property Office, the contents of which are herein incorporated by reference in their entirety.

TECHNICAL FIELD

The present invention relates to a semiconductor device.

DISCUSSION OF RELATED ART

As semiconductor elements become highly integrated, individual circuit patterns are further miniaturized to integrate more semiconductor elements in a small area. As a result, there is a sharp decrease in design rules of the semiconductor elements recently.

In highly scaled semiconductor elements, a process of forming a plurality of wiring lines and a plurality of buried contacts (BC) interposed between the plurality of wiring lines becomes increasingly complicated and difficult. Accordingly, proper structure configurations and finely adjusted processes may be needed to ensure that the semiconductor elements fabricated have reliable structures.

SUMMARY

Embodiments of the present invention provide a semiconductor device capable of enhancing reliability and performance.

According to an embodiment of the present invention, there is provided a semiconductor device including a substrate which includes a cell region and a core region, a boundary element separation film which is placed inside the substrate, and separates the cell region and the core region, and a bit line which is placed on the cell region and the boundary element separation film and extends along a first direction, in which the boundary element separation film includes a first region and a second region, a height of an upper side of the first region of the boundary element separation film is different from a height of an upper side of the second region of the boundary element separation film, on a basis of a bottom side of the boundary element separation film, and the bit line is placed over the first region of the boundary element separation film and the second region of the boundary element separation film.

According to an embodiment of the present invention, there is provided a semiconductor device including a substrate which includes a cell region and a core region, a boundary element separation film which is placed inside the substrate, and separates the cell region and the core region, a separation region capping film which is placed on the boundary element separation film, and a bit line which is placed on the cell region and the boundary element separation film and extends along a first direction, in which the boundary element separation film includes a first region and a second region, the separation region capping film is placed on the second region of the boundary element separation film, and is not placed on the first region of the boundary element separation film, an upper side of the first region of the boundary element separation film is placed on a plane the same as that of an upper side of the separation region capping film, and the bit line is placed over the first region of the boundary element separation film and the second region of the boundary element separation film.

According to an embodiment of the present invention, there is provided a semiconductor device including a substrate which includes a cell region and a core region, a boundary element separation film which is placed inside the substrate, separates the cell region and the core region, and includes a first region and a second region, a bit line structure which is placed on the cell region and the boundary element separation film, and includes a bit line extending along a first direction and a bit line capping film placed on the bit line, a gate electrode which is placed inside the substrate of the cell region and intersects the bit line, and a buffer layer which is placed on the boundary element separation film and extends along the first direction, in which the bit line is placed over the first region of the boundary element separation film and the second region of the boundary element separation film, the buffer layer is placed between the boundary element separation film and the bit line on the first region of the boundary element separation film, and is not placed on the second region of the boundary element separation film, and a lower side of the bit line comes into contact with an upper side of the buffer layer in the first region and comes into contact with an upper side of the boundary element separation film in the second region.

However, embodiments of the present invention are not restricted to the ones set forth herein. The above and other aspects of the present invention will become more apparent to one of ordinary skill in the art to which the present invention pertains by referencing the detailed description of the present invention given below.

BRIEF DESCRIPTION OF THE DRAWINGS

Embodiments of the present invention will be more clearly understood from the following detailed description taken in conjunction with the accompanying drawings in which.

Figure 1:
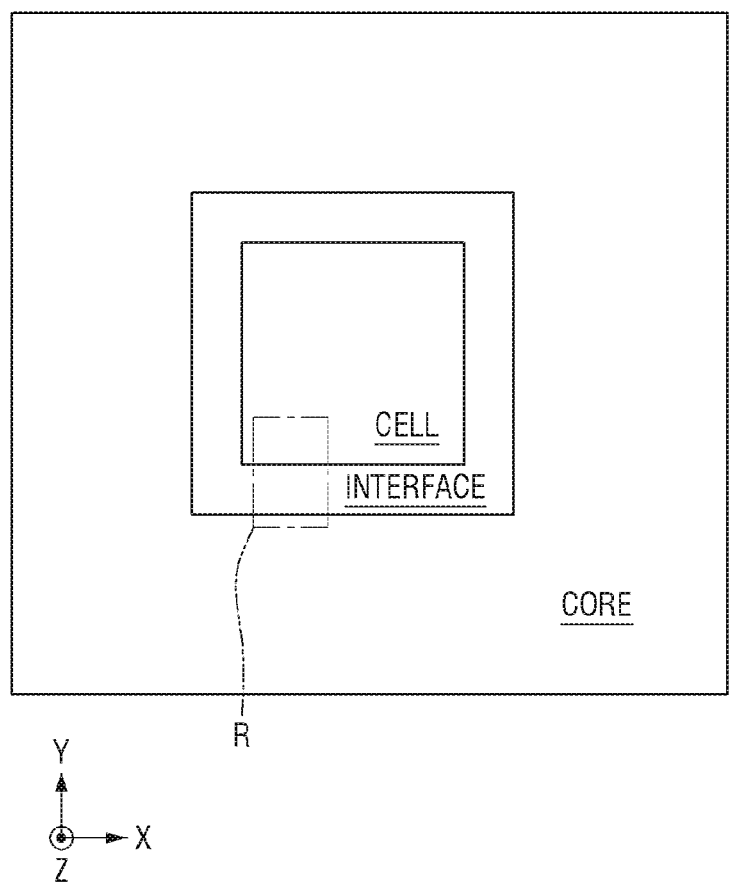
FIGS. 1 and 2 are layout diagrams for explaining a semiconductor device according to an embodiment of the present invention.

Since the drawings in FIGS. 1-24 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, embodiments of the present invention will be described in detail referring to the accompanying drawings. The same components on the drawings are denoted by same reference numerals, and repeated description thereof will not be provided.

In the drawings of a semiconductor device according to an embodiment of the present invention, although a Dynamic Random Access Memory (DRAM) device is shown as an example, the present invention is not limited thereto. For example, the semiconductor device may be a static RAM (SRAM) device, a phase-change RAM (PRAM) device, a magnetic RAM (MRAM) device, or a ferroelectric RAM (FRAM) device. Alternatively, the semiconductor device may be a logic semiconductor device, such as, for example, a central processing unit (CPU), a microprocessing unit (MPU), a graphics processing unit (GPU), or an application processor (AP).

Hereinafter, the semiconductor device according to an embodiment of the present invention will be described referring to FIGS. 1 to 3.

Figure 2:
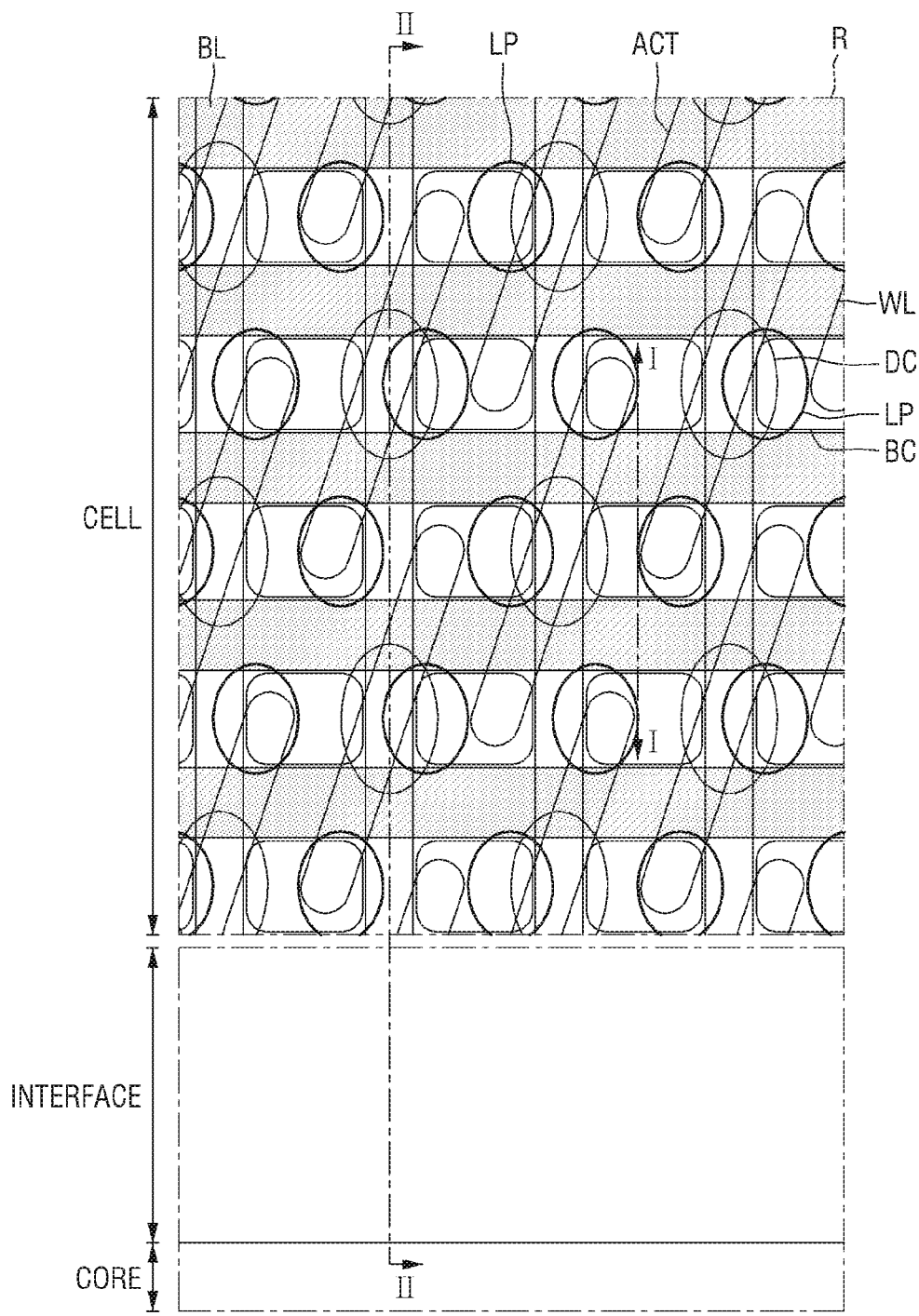

FIGS. 1 and 2 are layout diagrams for explaining a semiconductor device according to an embodiment of the present invention. FIG. 3 is a cross-sectional view taken along I-I of FIG. 2.

Referring to FIG. 1, the semiconductor device according to an embodiment of the present invention includes a cell region CELL, a core region CORE, and a boundary region INTERFACE. For example, a substrate of the semiconductor device includes the cell region CELL, the core region CORE, and the boundary region INTERFACE.

Semiconductor cells may be placed in the cell region CELL while forming an array. For example, when the semiconductor device to be formed is a semiconductor memory device, the semiconductor memory cells may be placed in the cell region CELL while forming an array.

The core region CORE may be placed around the cell region CELL, or may be placed in a separate region different from the cell region CELL. Some control elements and dummy elements may be formed in the core region CORE. Therefore, circuits required for controlling the semiconductor cells formed in the cell region CELL may be placed in the core region CORE.

The boundary region INTERFACE may be placed between the cell region CELL and the core region CORE. For example, the boundary region INTERFACE may be placed to be adjacent to the cell region CELL and the core region CORE, between the cell region CELL and the core region CORE. For example, as shown in FIG. 1, the boundary region INTERFACE may be placed between the cell region CELL and the core region CORE, and placed around the cell region CELL. Therefore, the boundary region INTERFACE may surround the cell region CELL. Also, the core region CORE may surround the boundary region INTERFACE and the cell region CELL.

A boundary element separation film (110a of FIG. 4) may be placed in the boundary region INTERFACE. The boundary element separation film 110a may be placed inside the substrate 100. Therefore, the boundary element separation film 110a may separate the cell region CELL and the core region CORE.

For reference, FIG. 2 is a diagram showing region R of FIG. 1 in detail.

Referring to FIG. 2, the semiconductor device according to an embodiment of the present invention may include a plurality of active regions ACT. The active regions ACT may be defined by a cell element separation film (110 of FIG. 4) formed inside the substrate (100 of FIG. 3).

With the reduction of design rules of the semiconductor device, the active region ACT may be placed in the form of a bar of a diagonal line or oblique line, as shown. For example, a plurality of bars may extend in parallel with each other in an arbitrary direction other than a first direction X and a second direction Y, on the plane in which the first direction X and the second direction Y extend.

A plurality of gate electrodes may be placed on the active region ACT and extending in the first direction X across the active region ACT. The plurality of gate electrodes may extend to be parallel to each other. The plurality of gate electrodes may be, for example, a plurality of word lines WL.

The word lines WL may be placed at equal intervals in the second direction Y, and buried in the substrate 100. A width of the word line WL and an interval between the word lines WL may be determined in accordance with the design rules.

A plurality of bit lines BL extending in the second direction Y orthogonal to the word line WL may be placed on the word line WL. Therefore, the bit lines BL may obliquely intersect the active regions ACT and may perpendicularly intersect the word lines WL. The bit lines BL may be placed on the cell region CELL and the boundary element separation film (110a of FIG. 4). The plurality of bit lines BL may extend to be parallel to each other.

The bit lines BL may be placed at equal intervals. The width of the bit lines BL or the interval between the bit lines BL may be determined in accordance with design rules.

The semiconductor device according to an embodiment of the present invention may include various contact arrangements formed on the active region ACT. Various contact arrangements may include, for example, a direct contact DC, a buried contact BC, a landing pad LP, and the like.

Here, the direct contact DC may mean a contact that electrically connects the active region ACT to the bit line BL. The buried contact BC may mean a contact that connects the active region ACT to a lower electrode (191 of FIG. 3) of the capacitor.

In view of the arrangement structure, a contact area between the buried contact BC and the cell active region ACT may be small. Accordingly, the conductive landing pad LP may be introduced to increase a contact area with the active region ACT and increase a contact area with a lower electrode (191 of FIG. 3) of the capacitor. A plurality of buried contacts BC may each be formed between two adjacent bit lines BL from among the plurality of bit lines BL, and between two adjacent word lines WL from among the plurality of word lines WL. The plurality of buried contacts BC may be arranged in a matrix in the first direction X and the second direction Y.

The landing pad LP may be placed between the active region ACT and the buried contact BC, and may be placed between the buried contact BC and the lower electrode (191 of FIG. 3) of the capacitor. In the semiconductor device according to an embodiment of the present invention, the landing pad LP may be placed between the buried contact BC and the lower electrode of the capacitor. By increasing the contact area through introduction of the landing pad LP, the contact resistance between the active region ACT and the lower electrode of the capacitor may be reduced.

In the semiconductor device according to an embodiment of the present invention, the direct contact DC may be placed in a central portion of the active region ACT. Since the direct contact DC may be electrically connected to the bit line BL, the central portion of the active region ACT may be electrically connected to the bit line BL through the direct contact DC. The buried contact BC may be placed at both end portions of the active region ACT.

As the buried contacts BC are placed at both end portions of the active region ACT, the landing pad LP may be placed to be adjacent to both end portions of the active region ACT and to partially overlap the buried contact BC.

Alternatively, the buried contact BC may be formed to overlap the active region ACT and the cell element separation film (110 of FIGS. 3 and 4) located between adjacent word lines WL and between adjacent bit lines BL.

The word line WL may be formed as a buried structure inside the substrate 100. The word line WL may be placed across the active region ACT between the direct contact DC and the buried contact BC.

As shown, two word lines WL may be placed to cross a single active region ACT. Since the active region ACT is diagonally placed, the word line WL may have an angle of less than 90 degrees with the active region ACT.

The buried contacts BC may be placed symmetrically. Therefore, the buried contacts BC may be placed on a straight line along the first direction X and the second direction Y.

Unlike the buried contacts BC, the landing pads LP may be placed in a zigzag manner in the second direction Y along which the bit line BL extends. Further, the landing pad LP may be placed to overlap the same side surface portion of each bit line BL in the first direction X along which the word line WL extends.

When a first line of the landing pads LP extending in the first direction X is arranged next to a second line of the landing pads LP extending in the first direction, each of the landing pads LP of the first line may overlap a left side of the corresponding bit line BL, and each of the landing pads LP of the second line may overlap a right side of the corresponding bit line BL.

The direct contact DC, the buried contact BC and the landing pad LP may each include a conductive material, and may each be a single layer made up of one type of conductive material, or multiple layers made up of combinations of various types of conductive materials. The direct contact DC, the buried contact BC and the landing pad LP may include, for example, at least one of an impurity-doped semiconductor material, a conductive silicide compound, a conductive metal nitride, or a metal.

Figure 3:
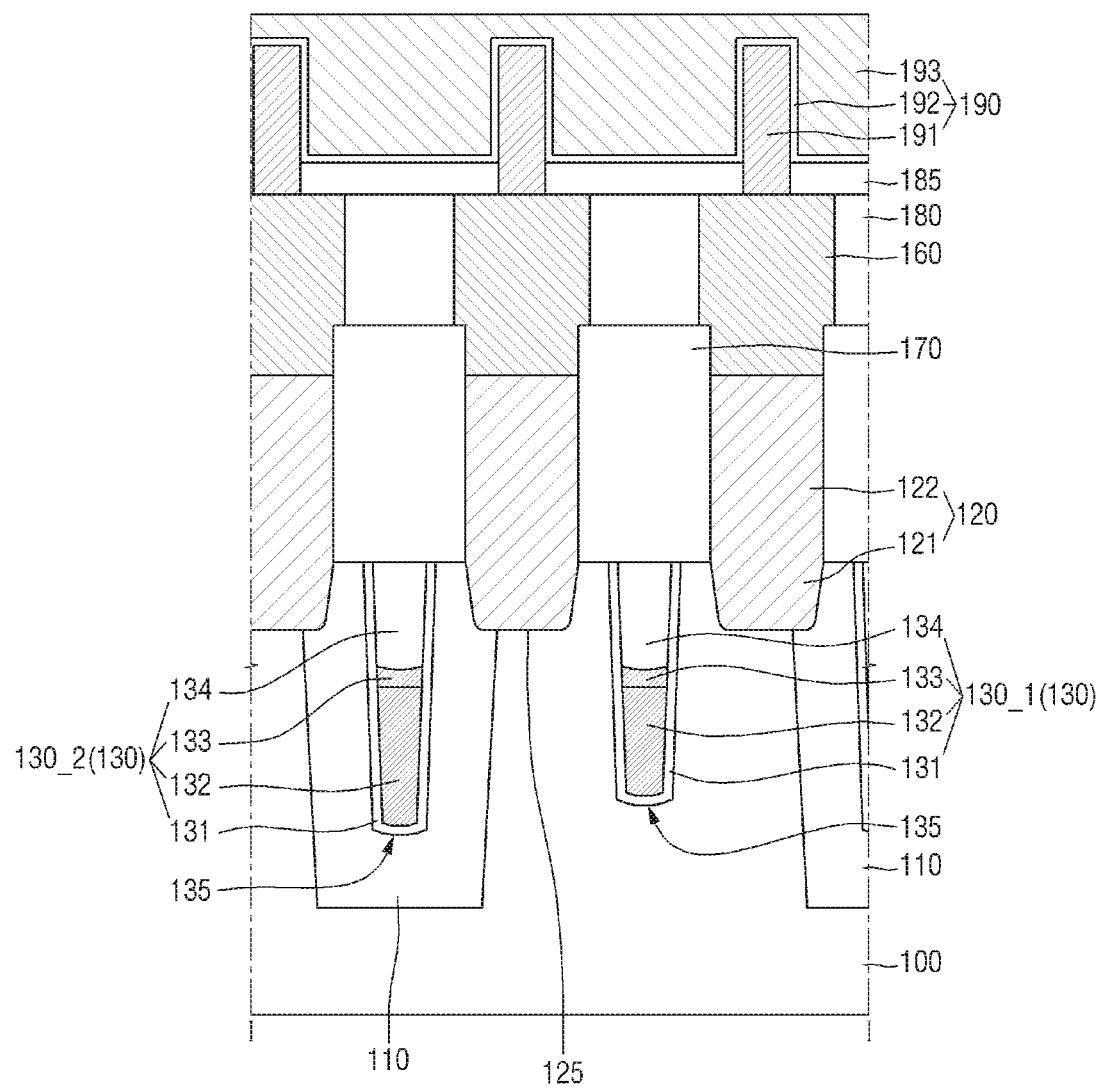
FIG. 3 is a cross-sectional view taken along I-I of FIG. 2.

Referring to FIG. 3, the semiconductor device according to an embodiment of the present invention may include a cell element separation film 110, a plurality of gate structures 130, a storage contact 120, and an information storage unit 190.

The substrate 100 may be bulk silicon (Si) or an SOI (silicon-on-insulator). In contrast, the substrate 100 may be a silicon (Si) substrate or may include, but is not limited to, silicon germanium (SiGe), SGOI (silicon germanium on insulator), indium antimonide (InSb), lead tellurium (PbTe) compounds, indium arsenide (InAs), indium phosphide (InP), gallium arsenide (GaAs), gallium phosphide (GaP), or gallium antimonide (GaSb). Also, the semiconductor substrate 100 may include one or more semiconductor layers or structures and may include active or operable portions of semiconductor devices. Hereinafter, the substrate 100 will be described as a silicon (Si) substrate.

The cell element separation film 110 may be formed inside the substrate 100. The cell element separation film 110 may have an STI (shallow trench isolation) structure having excellent element separation characteristics. In an embodiment of the present invention, a shallow isolation trench may be formed by removing an upper portion of the substrate 100 through an anisotropic etching process, and then an insulating film may be provided to fill the shallow isolation trench to form the cell element separation film 110. The cell element separation film 110 may define an active region ACT inside the substrate 100.

The active region ACT defined by the cell element separation film 110 may have a long island shape including a short axis and a long axis, as shown in FIG. 1. The active region ACT may have an oblique line shape to have an angle of less than 90 degrees with respect to the word line WL formed inside the cell element separation film 110. Further, the active region ACT may have an oblique line shape to have an angle of less than 90 degrees with respect to the bit line BL formed on the cell element separation film 110. That is, the active region ACT may extend in a direction having a predetermined angle with respect to the first direction X and the second direction Y.

The cell element separation film 110 may include, but is not limited to, at least one of, for example, a silicon oxide ($SiO_2$) film, a silicon nitride ($Si_3N_4$) film or a silicon oxynitride (SiON) film. In the semiconductor device according to an embodiment of the present invention, the cell element separation film 110 will be described as including a silicon oxide ($SiO_2$) film.

In FIG. 3, although the cell element separation film 110 is described as being formed of a single insulating film, this is only for convenience of explanation, and the present invention is not limited thereto. For example, the cell element separation film 110 may be a double layer including two kinds of insulating layers, or a multiple layer including a combination of at least three kinds of insulating layers. For example, the cell element separation film 110 may include two different kinds of insulating layers such as, for example, a silicon oxide ($SiO_2$) layer and a silicon nitride ($Si_3N_4$) layer.

In FIG. 3, an upper side of the cell element separation film 110 and an upper side of the substrate 100 are shown to be placed on the same plane, this is only for convenience of explanation, and the present invention is not limited thereto.

The gate structure 130 may be formed inside the substrate 100 and the cell element separation film 110. The gate structure 130 may be formed across the cell element separation film 110 and the active region ACT defined by the cell element separation film 110. That is, the single gate structure 130 may be formed inside the substrate 100 and the cell element separation film 110 located in the direction along which the gate structure 130 extends.

In FIG. 3, one of adjacent first and second gate structures 130_1 and 130_2 may be formed inside the cell element separation film 110, and the other one may be formed inside the substrate 100. For example, as shown in FIG. 3, the first gate structure 130_1 is formed inside the substrate 100, and the second gate structure 130_2 is formed inside the cell element separation film 110. However, at one other location, the first gate structure 130_1 may be formed inside the cell element separation film 110, and the second gate structure 130_2 may be formed inside the substrate 100.

The gate structure 130 may include a gate trench 135, a gate insulating film 131, a gate electrode 132, a first gate capping pattern 133 and a second gate capping pattern 134 that are formed inside the substrate 100 and the cell element separation film 110.

The gate structure 130 may intersect a cell conductive line 220, and may be placed inside the substrate 100 of the cell region CELL. The gate structure 130 may extend along the first direction X. Here, the gate electrode 132 may correspond to the word line WL. The cell conductive line 220 may correspond to the bit line BL.

The gate insulating film 131 may extend along the side walls and bottom side of the gate trench 135. The gate insulating film 131 may extend along a profile of at least a part of the gate trench 135.

The gate insulating film 131 may include silicon oxide ($SiO_2$), silicon nitride ($Si_3N_4$), silicon oxynitride (SiON) or a high dielectric constant material having a dielectric constant higher than that of silicon oxide ($SiO_2$). For example, the gate insulating film 131 may be formed of, for example, hafnium oxide ($HfO_2$), aluminum oxide ($Al_2O_3$), hafnium aluminum oxide ($HfAlO_3$), tantalum oxide ($Ta_2O_5$), or titanium oxide ($TiO_2$).

The gate electrode 132 may be formed on the gate insulating film 131, and may fill a part of the gate trench 135. The gate electrode 132 may intersect the cell conductive line 220.

The gate electrode 132 may include, for example, a conductive metal oxide, a conductive metal oxynitride, or the like, and may also include an oxidized form of metallic materials.

The first gate capping pattern 133 may be formed on the gate electrode 132. The second gate capping pattern 134 may be formed on the first gate capping pattern 133. The first gate capping pattern 133 and the second gate capping pattern 134 may fill the remaining gate trench 135 in which the gate electrode 132 is formed. The first gate capping pattern 133 may extend along the top surface of the gate electrode 132. In an embodiment of the present invention, the end of the first gate capping pattern 133 may be aligned with the end of the gate electrode 132.

The first gate capping pattern 133 may include, for example, at least one of silicon nitride ($Si_3N_4$), silicon oxynitride (SiON), silicon oxide ($SiO_2$), silicon carbonitride (SiCN), silicon oxycarbonitride (SiOCN), or a combination thereof.

The second gate capping pattern 134 may include, for example, at least one of silicon nitride ($Si_3N_4$), silicon oxynitride (SiON), silicon oxide ($SiO_2$), silicon carbonitride (SiCN), silicon oxycarbonitride (SiOCN), or a combination thereof.

Although FIGS. 4 to 6B show that the upper side of the second gate capping pattern 134, the upper side of the cell element separation film 110, and the upper side of the substrate 100 are shown as being placed on the same plane, this is only for convenience of explanation, and the present invention is not limited thereto.

Although the gate insulating film 131 is shown as extending along the side walls of the first gate capping pattern 133 and the side walls of the second gate capping pattern 134, the present invention is not limited thereto. For example, the gate insulating film 131 extends along the side walls of the gate electrode 132, but may not extend along the side walls of the first gate capping pattern 133 and the side walls of the second gate capping pattern 134. For example, the top surface of the gate insulating film 131 may be covered by the first gate capping pattern 133.

In FIG. 3, a position of a lowermost part of the first gate structure 130_1 formed in the substrate 100 may be different from a position of a lowermost part of the second gate structure 130_2 formed in the cell element separation film 110. For example, a distance from the first interlayer insulating film 170 to the lowermost part of the first gate structure 130_1 may be smaller than a distance from the first interlayer insulating film 170 to the lowermost part of the second gate structure 130_2.

In a process of forming the gate trench 135, because an etching rate of the substrate 100 and an etching rate of the cell element separation film 110 are different from each other, the position of the lowermost part of the first gate structure 130_1 formed in the substrate 100 may differ from the position of the lowermost part of the second gate structure 130_2 formed in the cell element separation film 110. Also, with a different etching process being used and/or the cell element separation film 110 including a different material, the maximum width of the first gate structure 130_1 in the second direction Y may be different from the maximum width of the second gate structure 130_2 in the second direction Y.

An impurity doping region may be formed on at least one side of the gate structure 130. The impurity doping region may be a source/drain region of the transistor.

The storage contact 120 may be formed on the substrate 100, and may be placed between the first gate structure 130_1 and the second gate structure 130_2. The storage contact 120 may include a portion extending along the side walls of the first interlayer insulating film 170. The storage contact 120 may correspond to the buried contact BC.

The storage contact 120 may fill a storage contact recess 125. The storage contact recess 125 may be a recess formed inside the substrate 100 and the cell element separation film 110.

The storage contact 120 may include a lower part 121 and an upper part 122. The lower part 121 of the storage contact 120 may fill the storage contact recess 125. For example, the lower part 121 of the storage contact may be formed inside the substrate 100 and the cell element separation film 110. The upper part 122 of the storage contact is formed on the lower part 121 of the storage contact. The upper part 122 of the storage contact may extend along the side walls of the first interlayer insulating film 170.

The storage contact 120 may be connected to the source/drain region. The storage contact 120 may include, for example, at least one of an impurity-doped semiconductor material, a conductive silicide compound, a conductive metal nitride, or a metal. For example, in an embodiment of the present invention, the storage contact 120 may include impurity-doped polysilicon (p-Si).

The storage pad 160 may be formed on the storage contact 120, and may be electrically connected to the storage contact 120. Here, the storage pad 160 may correspond to the landing pad LP.

The storage pad 160 may include, for example, at least one of an impurity-doped semiconductor material, a conductive silicide compound, a conductive metal nitride, or a metal. For example, in an embodiment of the present invention, the storage pad 160 may be formed of a material that contains a metal such as, for example, tungsten (W).

The second interlayer insulating film 180 may be formed on the storage pad 160 and the first interlayer insulating film 170. The second interlayer insulating film 180 may define a region of the storage pad 160 that forms a plurality of isolation regions. Further, the second interlayer insulating film 180 may be patterned to expose a part of the upper side of the storage pad 160.

The second interlayer insulating film 180 may include an insulating material to electrically separate a plurality of storage pads 160 from each other. For example, the second interlayer insulating film 180 may include, but is not limited to, a silicon oxide ($SiO_2$) film, a silicon nitride ($Si_3N_4$) film, a silicon oxynitride (SiON) film, or a combination thereof.

An etching stop film 185 may be placed on the upper side of the second interlayer insulating film 180 and the upper side of the storage pad 160. The etching stop film 185 may extend along the upper side of the second interlayer insulating film 180 and the upper side of the storage pad 160.

The information storage unit 190 may be formed on the second interlayer insulating film 180, and may be electrically connected to the storage pad 160. Therefore, the information storage unit 190 may be electrically connected to the storage contact 120 through the storage pad 160.

The information storage unit 190 may include, for example, but is not limited to, a capacitor. The information storage unit 190 includes a lower electrode 191, a capacitor insulating film 192, and an upper electrode 193.

The lower electrode 191 may have, for example, a cylinder shape. The storage contact 120 and the storage pad 160 may be used to connect the active region ACT to the lower electrode 191 of the information storage unit 190. For example, the plurality of storage pads 160 may each be arranged to partially overlap the storage contact 120 along the direction (e.g., the third direction Z) orthogonal to the upper surface of the substrate 100 so as to connect the active region ACT to the lower electrode 191.

The capacitor insulating film 192 is formed on the lower electrode 191, and may be formed along the upper side and a part of the side surfaces of the lower electrode 191. The capacitor insulating film 192 may be formed along the upper side of the etching stop film 185.

The upper electrode 193 is formed on the capacitor insulating film 192. The upper electrode 193 may surround the side walls of the lower electrode 191.

The lower electrode 191 may include, for example, but is not limited to, a doped semiconductor material, a conductive metal nitride (e.g., titanium nitride (TiN), tantalum nitride (TaN), or tungsten nitride (WN), etc.), a metal (e.g., ruthenium (Ru), iridium (Jr), titanium (Ti), or tantalum (Ta), etc.), a conductive metal oxide (e.g., iridium oxide ($IrO_2$), etc.), or the like.

The capacitor insulating film 192 may include, for example, but is not limited to, silicon oxide ($SiO_2$), silicon nitride ($Si_3N_4$), silicon oxynitride (SiON), hafnium oxide ($HfO_2$), hafnium silicon oxide ($HfSi_xO_y$), lanthanum oxide ($La_2O_3$), lanthanum aluminum oxide ($LaAl_xO_y$), zirconium oxide ($ZrO_2$), zirconium silicon oxide ($ZrSi_xO_y$), tantalum oxide ($Ta_2O_5$), titanium oxide ($TiO_2$), barium strontium titanium oxide ($BaSr_xTi_yO_z$), barium titanium oxide ($BaTi_xO_y$), strontium titanium oxide ($SrTi_xO_y$), yttrium oxide ($Y_2O_3$), aluminum oxide ($Al_2O_3$), lead scandium tantalum oxide ($Pb(Sc,Ta)O_3$), lead zinc niobate [$Pb(Zn_{1/3}Nb_{2/3})O_3$], or a combination thereof.

The upper electrode 193 may include, for example, at least one of a doped semiconductor material, a metal, a conductive metal nitride, or a metal silicide.

Figure 4:
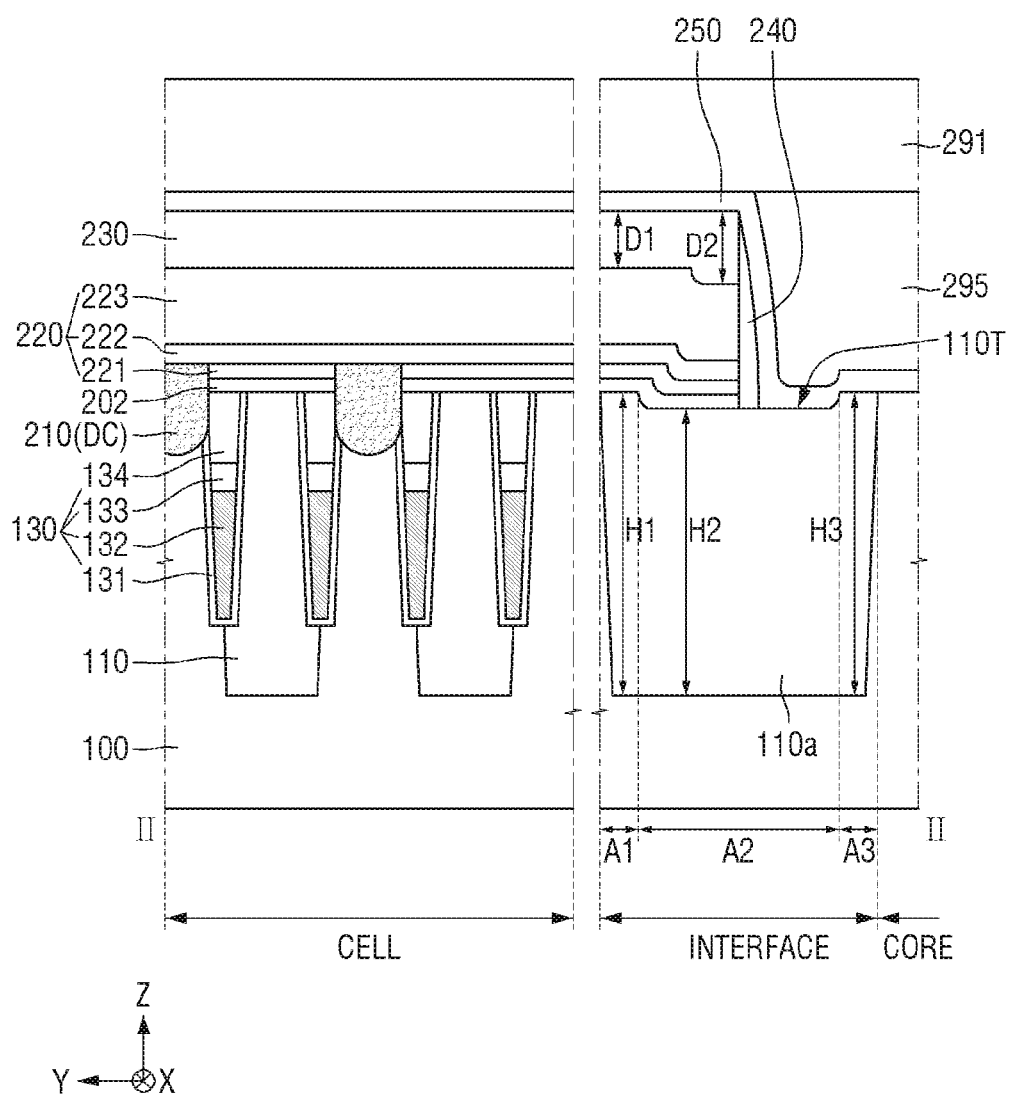
FIG. 4 is a cross-sectional view taken along II-II of FIG. 2 to explain a semiconductor device according to an embodiment of the present invention.

FIG. 4 is a cross-sectional view taken along II-II of FIG. 2 to explain a semiconductor device according to an embodiment of the present invention.

For convenience of explanation, repeated parts of contents explained with reference to FIGS. 1 to 3 will be omitted or simplified.

Referring to FIG. 4, the semiconductor device according to an embodiment of the present invention may further include a buffer layer 202, a bit line structure, a bit line contact 210, a first interlayer insulating film 170, and a second interlayer insulating film 180.

The buffer layer 202 may be formed on the substrate 100, the cell element separation film 110, the gate structure 130 and the boundary element separation film 110a. On the boundary element separation film 110a, the buffer layer 202 may extend along the profile of an upper side of a first region A1 and the profile of an upper side of a second region A2 of the boundary element separation film 110a.

The buffer layer 202 may extend in the second direction Y along the upper side of the substrate 100, the upper side of the cell element separation film 110, the upper side of the gate structure 130 and the upper side of the boundary element separation film 110a. The buffer layer 202 may come into contact with the side surfaces of the bit line contact 210. The buffer layer 202 may be placed below the cell conductive line 220.

The buffer layer 202 may be a single film as shown, but the present invention is not limited thereto. For example, the buffer layer 202 may be multiple films including a first buffer layer and a second buffer layer. For example, although the first buffer layer may include a silicon oxide ($SiO_2$) film and the second buffer layer may include a silicon nitride ($Si_3N_4$) film, the present invention is not limited thereto.

The bit line structure may be placed on the buffer layer 202, and may extend in the second direction Y. The bit line structure may come into contact with the bit line contact 210.

The bit line structure may include a cell conductive line 220, a cell line capping film 230, a cell line spacer 240, and a second etching stop film 250.

The cell conductive line 220 may be formed on the cell region CELL of the substrate 100 on which the gate structure 130 is formed, and on the cell element separation film 110. The bit line contact 210 may be disposed on the cell region CELL of the substrate 100, and may be electrically connected to the cell conductive line 220. As a result, the substrate 100 disposed below the bit line contact 210 may be electrically connected to the cell conductive line 220. The cell conductive line 220 may be placed over the first region A1 and the second region A2 of the boundary element separation film 110a. The cell conductive line 220 may extend along the second direction Y.

The cell conductive line 220 may intersect the cell element separation film 110, and the active region ACT defined by the cell element separation film 110. The cell conductive line 220 may be formed to intersect the gate structure 130. Here, the cell conductive line 220 may correspond to the bit line BL. In other words, the bit line BL may be placed over the first region A1 of the boundary element separation film 110a and the second region A2 of the boundary element separation film 110a.

The cell conductive line 220 may be multiple films. The cell conductive line 220 may include, for example, a first cell conductive film 221, a second cell conductive film 222, and a third cell conductive film 223. The first to third cell conductive films 221, 222 and 223 may be sequentially stacked on the substrate 100 and the cell element separation film 110. Although the cell conductive line 220 is shown as a triple film, the present invention is not limited thereto.

The first to third cell conductive films 221, 222 and 223 may each include, for example, at least one of an impurity-doped semiconductor material, a conductive silicide compound, a conductive metal nitride, a metal, or a metal alloy. For example, the first cell conductive film 221 may include a doped semiconductor material, the second cell conductive film 222 may include at least one of a conductive silicide compound or a conductive metal nitride, and the third cell conductive film 223 may include at least one of a metal or a metal alloy. For example, in an embodiment of the present invention, the first cell conductive film 221 may include doped polysilicon (p-Si), the second cell conductive film 222 may include titanium silicon nitride (TiSiN), and the third cell conductive film 223 may include tungsten (W). However, the present invention is not limited thereto.

The cell line capping film 230 may be placed on the cell conductive line 220. The cell line capping film 230 may extend in the second direction Y along the upper side of the cell conductive line 220. Since the cell conductive line 220 may correspond to the bit line BL, the cell line capping film 230 may also be referred to as a bit line capping film.

The upper side of the cell line capping film 230 on the first region A1 and the upper side of the cell line capping film 230 on the second region A2 may be placed on the same plane.

The cell line capping film 230 may include, for example, at least one of silicon nitride ($Si_3N_4$) film, silicon oxynitride (SiON), silicon carbonitride (SiCN) or silicon oxycarbonitride (SiOCN). In the semiconductor memory device according to an embodiment of the present invention, the cell line capping film 230 may include, for example, a silicon nitride ($Si_3N_4$) film.

Although the cell line capping film 230 is shown as a single film, the present invention is not limited thereto. That is, for example, the cell line capping film 230 may be multiple films. However, when each film that constitutes the multiple films is the same material, the cell line capping film 230 may be seen as a single film.

The cell line spacer 240 may be placed on the side walls of the buffer layer 202, the cell conductive line 220, and the cell line capping film 230. The cell line spacer 240 may extend from the upper side of the boundary element separation film 110a in the third direction Z that intersects the first direction X and the second direction Y. For example, the cell line spacer 240 may be placed over the second region A2 of the boundary element separation film 110a.

The cell line spacer 240 may be a single film as shown, but the present invention is not limited thereto. For example, the cell line spacer 240 may be multiple films including first to fourth cell line spacers. For example, the first to fourth cell line spacers may each include, but is not limited to, silicon oxide ($SiO_2$) film, silicon nitride ($Si_3N_4$) film, silicon oxynitride (SiON) film, silicon oxycarbonitride (SiOCN) film, air, or a combination thereof.

The second etching stop film 250 may be placed on the substrate 100. The second etching stop film 250 may be formed along the profile of the cell line capping film 230 and the profile of the cell line spacer 240. The second etching stop film 250 may surround the cell line capping film 230 and the cell line spacer 240. In addition, the second etching stop film 250 may also be formed along the profile of top surfaces of the boundary element separation film 110a and the substrate 100 not covered by the cell line spacer 240 and the buffer layer 202 in the boundary region INTERFACE and the core region CORE.

The second etching stop film 250 may include, for example, at least one of silicon nitride ($Si_3N_4$) film, silicon oxynitride (SiON), silicon carbonitride (SiCN), or silicon oxycarbonitride (SiOCN).

The bit line contact 210 may electrically connect the cell conductive line 220 and the substrate 100. Here, the bit line contact 210 may correspond to a direct contact DC.

A lower part of the bit line contact 210 may be formed inside the substrate 100. The upper side of the bit line contact 210 may be placed inside the bit line structure. For example, the upper side of the bit line contact 210 may come into contact with the second cell conductive film 222.

In FIG. 4, in a region that overlaps the upper side of the bit line contact 210, the cell conductive line 220 may include a second cell conductive film 222 and a third cell conductive film 223. In a region that does not overlap the upper side of the bit line contact 210, the cell conductive line 220 may include first to third cell conductive films 221, 222 and 223. For example, the upper side of the first cell conductive film 221 and the upper side of the bit line contact 210 may be placed on the same plane.

The bit line contact 210 may include, for example, at least one of an impurity-doped semiconductor material, a conductive silicide compound, a conductive metal nitride, or a metal.

A cell interlayer insulating film 295 may be formed on the substrate 100 and the boundary element separation film 110a, and may be placed inside the boundary region INTERFACE. A portion of the cell interlayer insulating film 295 may also be formed in the core region CORE. The cell interlayer insulating film 295 may be formed on the side wall of the bit line structure. For example, the cell interlayer insulating film 295 may be placed on the second etching stop film 250.

The cell interlayer insulating film 295 may include, for example, an oxide-based insulating material. For example, in an embodiment of the present invention, the cell interlayer insulating film 295 may include silicon oxide ($SiO_2$).

An insertion interlayer insulating film 291 may be formed on the substrate 100. The insertion interlayer insulating film 291 may be formed on the bit line structure and the cell interlayer insulating film 295. The insertion interlayer insulating film 291 may cover the bit line structure and the cell interlayer insulating film 295.

The insertion interlayer insulating film 291 may include, for example, a nitride-based insulating material.

Referring to FIG. 4, in the semiconductor device according to an embodiment of the present invention, the boundary element separation film 110a may include a first region A1 and a second region A2.

The first region A1 may be a region that is nearer to the cell region CELL than the second region A2. The boundary element separation film 110a may include a trench 110T inside the second region A2.

A height H1 of the upper side of the first region A1 of the boundary element separation film 110a may be different from a height H2 of the upper side of the second region A2 of the boundary element separation film 110a, on the basis of the bottom side of the boundary element separation film 110a. When the height H1 of the upper side of the first region A1 of the boundary element separation film 110a and the height H2 of the upper side of the second region A2 of the boundary element separation film 110a are compared based on the basis of the bottom side of the boundary element separation film 110a, each of the height H1 and the height H2 is measured from the bottom side of the boundary element separation film 110a. For example, the height H1 of the upper side of the first region A1 of the boundary element separation film 110a may be higher than the height H2 of the upper side of the second region A2 of the boundary element separation film 110a, on the basis of the bottom side of the boundary element separation film 110a.

The boundary element separation film 110a may further include a third region A3. The third region A3 may be a region that is nearer to the core region CORE than the second region A2. The second region A2 may be placed between the first region A1 and the third region A3.

A height H3 of the upper side of the third region A3 of the boundary element separation film 110a may be different from the height H2 of the upper side of the second region A2 of the boundary element separation film 110a, on the basis of the bottom side of the boundary element separation film 110a. For example, the height H3 of the upper side of the third region A3 of the boundary element separation film 110a may be higher than the height H2 of the upper side of the second region A2 of the boundary element separation film 110a, on the basis of the bottom side of the boundary element separation film 110a. In an embodiment of the present invention, the height H3 of the upper side of the third region A3 of the boundary element separation film 110a may be the same as the height H1 of the upper side of the first region A1 of the boundary element separation film 110a, but the present invention is not limited thereto.

A thickness D1 of the cell line capping film 230 in the first region A1 of the boundary element separation film 110a may be smaller than a thickness D2 of the cell line capping film 230 in the second region A2 of the boundary element separation film 110a.

Figure 5A:
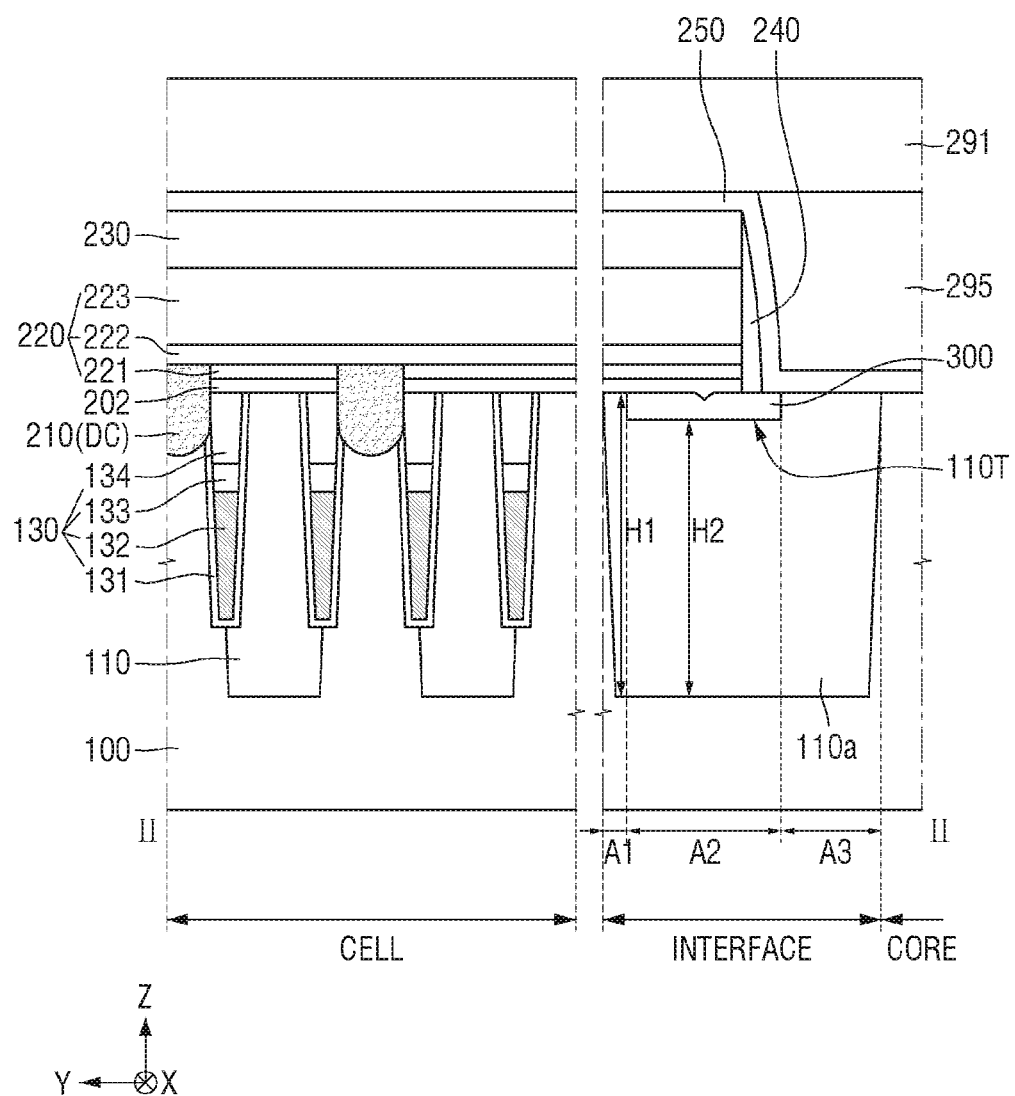
FIGS. 5A and 5B are cross-sectional views each taken along II-II of FIG. 2 to explain a semiconductor device according to an embodiment of the present invention.
Figure 5B:
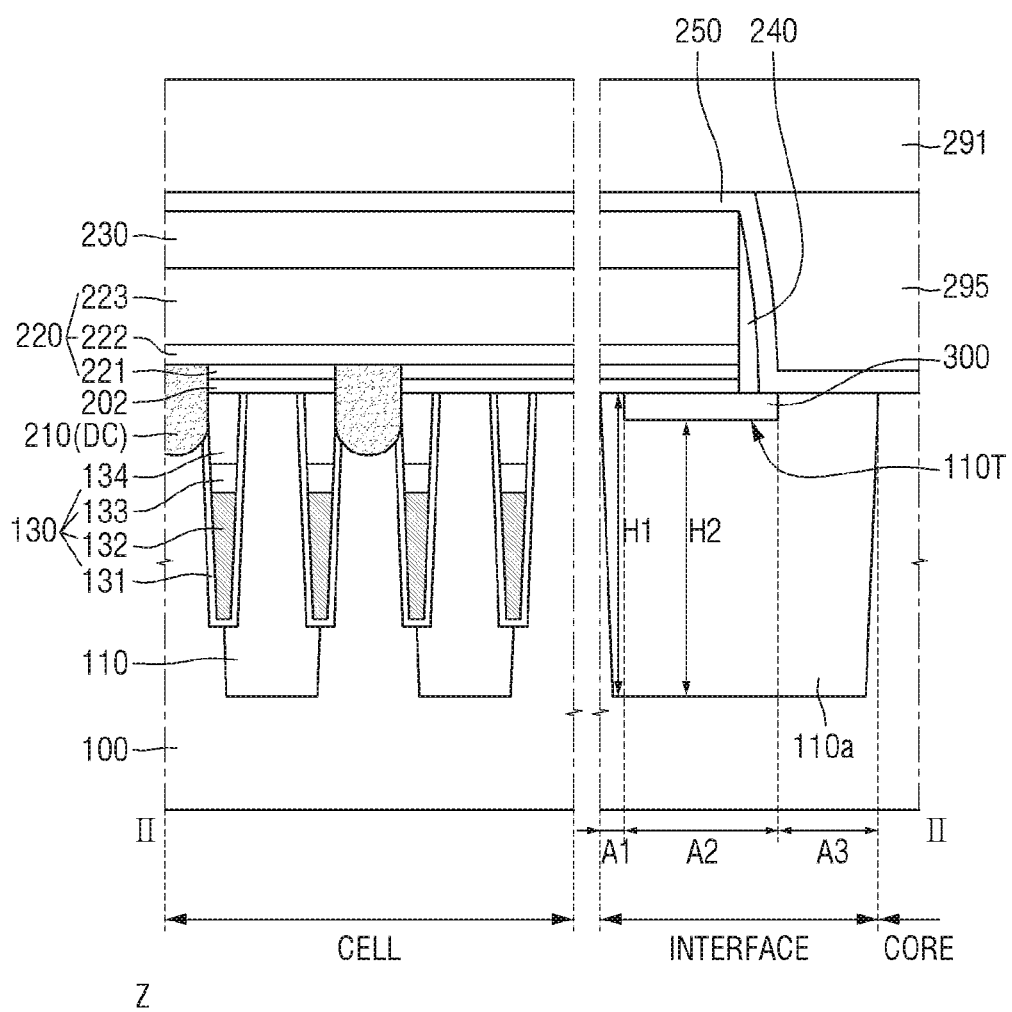

FIGS. 5A and 5B are cross-sectional views each taken along II-II of FIG. 2 to explain a semiconductor device according to an embodiment of the present invention. For reference, points different from those described with reference to FIG. 4 will be mainly described.

For convenience of explanation, the points different from those described with reference to FIG. 3 will be mainly described.

Referring to FIG. 5A, the semiconductor device according to an embodiment of the present invention may further include a separation region capping film 300.

The separation region capping film 300 may be placed on the second region A2 of the boundary element separation film 110a. The separation region capping film 300 may not be placed on the first region A1 of the boundary element separation film 110a. For example, the separation region capping film 300 may not extend to the first region A1 of the boundary element separation film 110a. The region of the boundary element separation film 110a overlapped by the separation region capping film 300 in the third direction Z may be defined as the second region A2. The separation region capping film 300 may include, for example, at least one of silicon nitride (Si$_3$N$_4$), silicon oxynitride (SiON), silicon oxide (SiO$_2$), silicon carbonitride (SiCN), silicon oxycarbonitride (SiOCN), or a combination thereof. In an embodiment of the present invention, the separation region capping film 300 and the second gate capping pattern 134 may be formed of the same material.

The separation region capping film 300 may be placed between the upper side of the boundary element separation film 110a and the bit line structure. For example, the separation region capping film 300 may be placed between the upper side of the boundary element separation film 110a and the buffer layer 202.

The height H1 of the upper side of the first region A1 of the boundary element separation film 110a may be different from the height H2 of the upper side of the second region A2 of the boundary element separation film 110a, on the basis of the bottom side of the boundary element separation film 110a. For example, the height H1 of the upper side of the first region A1 of the boundary element separation film 110a may be higher than the height H2 of the upper side of the second region A2 of the boundary element separation film 110a, on the basis of the bottom side of the boundary element separation film 110a. For example, the height H1 of the upper side of the first region A1 and the upper side of the third region A3 of the boundary element separation film 110a may be higher than the height H2 of the upper side of the second region A2 of the boundary element separation film 110a. Here, the upper side of the first region A1 of the boundary element separation film 110a and the upper side of the third region A3 of the boundary element separation film 110a have the same height H1.

The height H1 of the upper side of the first region A1 of the boundary element separation film 110a may be the same as the height of the upper side of the separation region capping film 300 on the second region A2 of the boundary element separation film 110a, on the basis of the bottom side of the boundary element separation film 110a. For example, the upper side of the first region A1 of the boundary element separation film 110a may be located on a plane the same as that of the upper side of the separation region capping film 300 on the second region A2 of the boundary element separation film 110a.

The upper side of the separation region capping film 300 may have a plate shape, as shown in FIG. 5B. However, this is merely an example, and the present invention is not limited thereto. For example, as shown in FIG. 5A, the upper side of the separation region capping film 300 may have a groove that is recessed in the third direction Z toward the substrate 100.

On the boundary element separation film 110a, the buffer layer 202 may extend along the profiles of the upper side of the first region A1 of the boundary element separation film 110a and the upper side of the separation region capping film 300 on the second region A2. The cell line spacer 240 may overlap the separation region capping film 300 in the third direction Z, but the present invention is not limited thereto. A portion of the separation region capping film 300 may be in direct contact with the second etching stop film 250, but the present invention is not limited thereto.

Figure 6A:
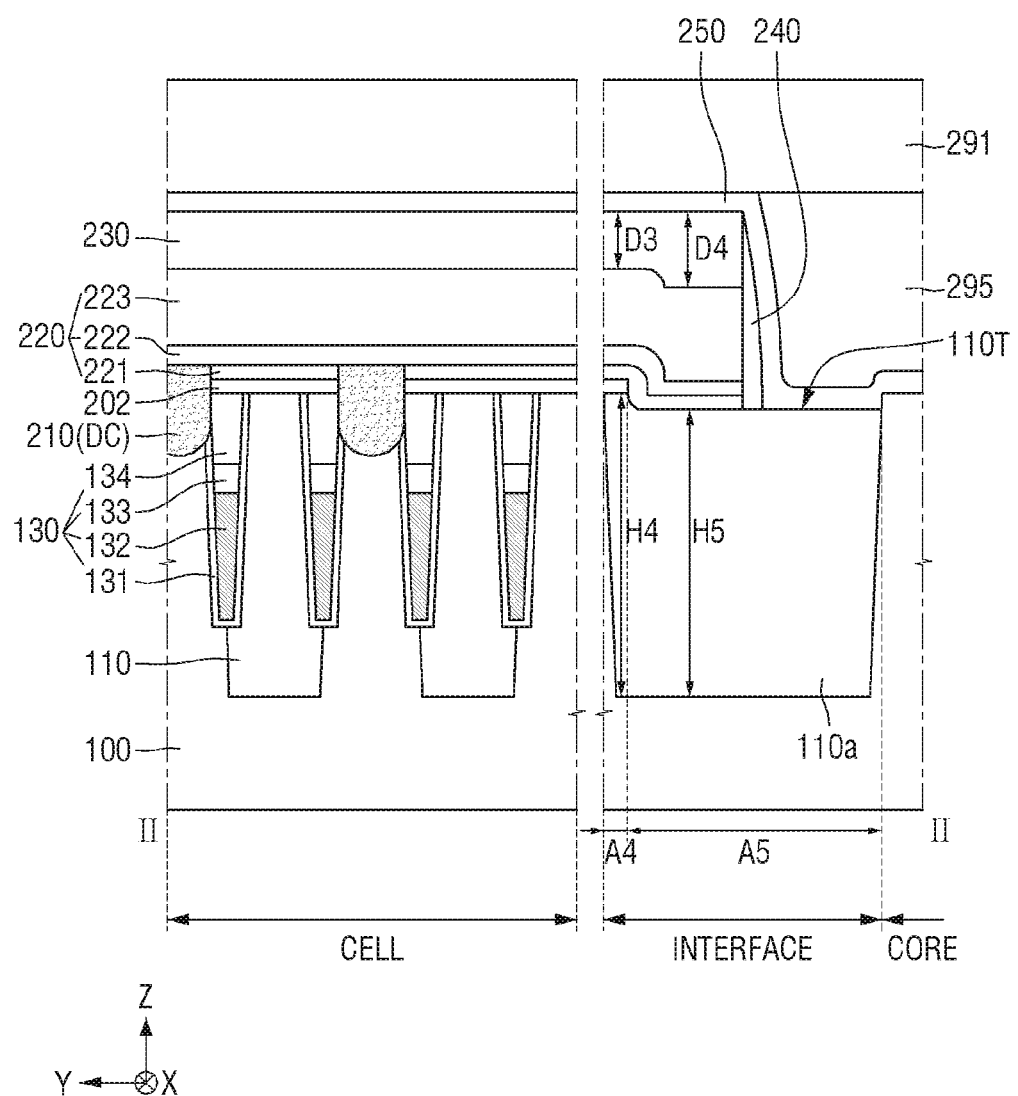
FIGS. 6A and 6B are cross-sectional views each taken along II-II of FIG. 2 to explain a semiconductor device according to an embodiment of the present invention.
Figure 6B:
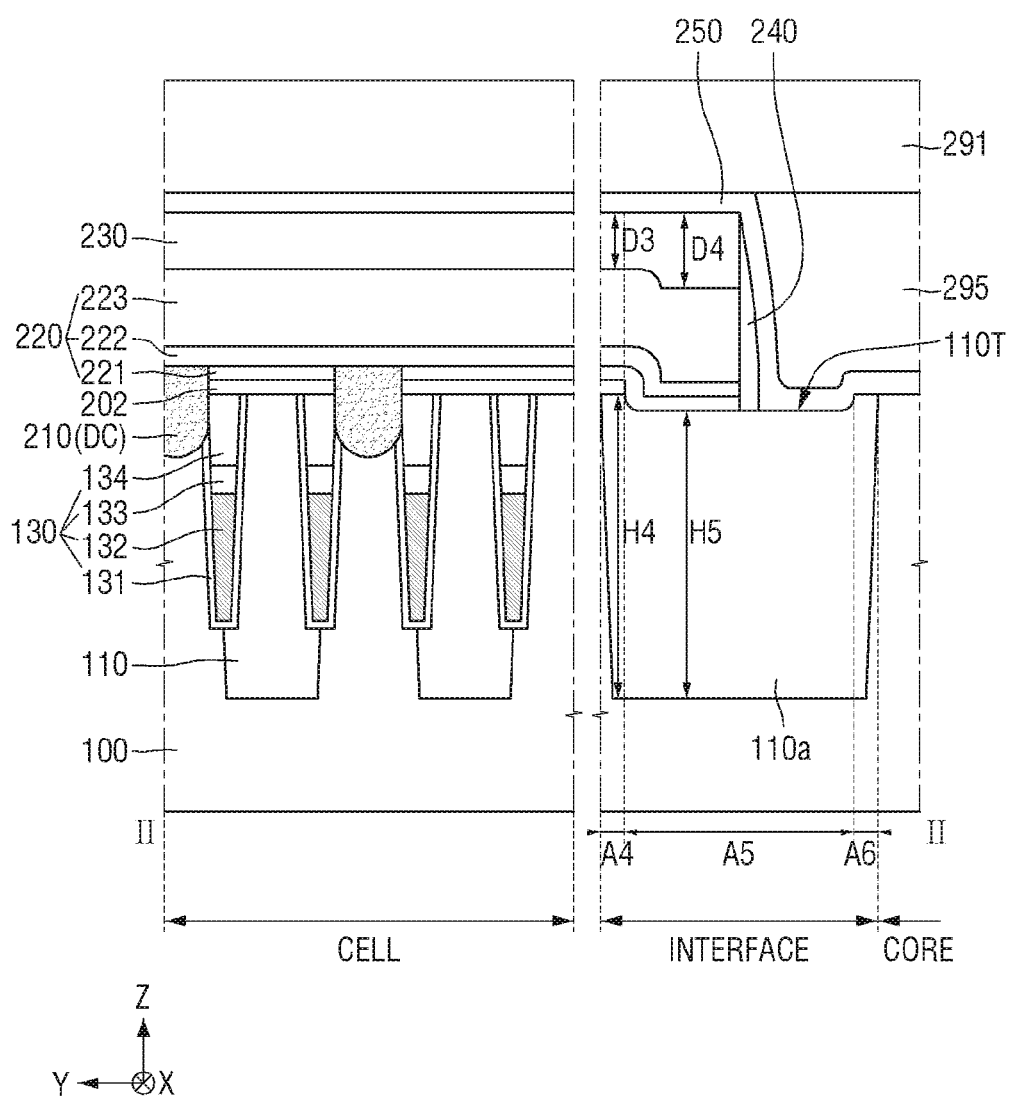

FIGS. 6A and 6B are cross-sectional views each taken along II-II of FIG. 2 to explain a semiconductor device according to an embodiment of the present invention. For reference, points different from those described with reference to FIGS. 4, 5A and 5B will be mainly described.

Referring to FIGS. 6A and 6B, in the semiconductor device according to an embodiment of the present invention, the boundary element separation film 110a may include a fourth region A4 and a fifth region A5.

The fourth region A4 may be a region that is nearer to the cell region CELL than the fifth region A5.

In the semiconductor device according to an embodiment of the present invention, the buffer layer 202 may be placed on the boundary element separation film 110a, and may extend along the second direction Y.

The buffer layer 202 may be placed on the fourth region A4 of the boundary element separation film 110a. On the fourth region A4, the buffer layer 202 may be placed between the boundary element separation film 110a and the cell conductive line 220. The buffer layer 202 may extend along the second direction Y from the cell region CELL to the boundary region INTERFACE.

The buffer layer 202 may not be placed on the fifth region A5 of the boundary element separation film 110a. The buffer layer 202 may not be placed between the boundary element separation film 110a and the cell conductive line 220 in the fifth region A5.

A thickness D3 of the cell line capping film 230 in the fourth region A4 of the boundary element separation film 110a may be smaller than a thickness D4 of the cell line capping film 230 in the fifth region A5 of the boundary element separation film 110a.

The cell conductive line 220 may be placed over the fourth region A4 of the boundary element separation film 110a and the fifth region A5 of the boundary element separation film 110a. In the fourth region A4, the lower side of the cell conductive line 220 may come into contact with the upper side of the buffer layer 202. In the fifth region A5, the lower side of the cell conductive line 220 may come into contact with the upper side of the boundary element separation film 110a.

A height H4 of the upper side of the fourth region A4 of the boundary element separation film 110a may be different from a height H5 of the upper side of the fifth region A5 of the boundary element separation film 110a, on the basis of the bottom side of the boundary element separation film 110a. For example, the height H4 of the upper side of the fourth region A4 of the boundary element separation film 110a may be higher than the height H5 of the upper side of the fifth region A5 of the boundary element separation film 110a, on the basis of the bottom side of the boundary element separation film 110a.

The boundary element separation film 110a may include a trench 110T inside the fifth region A5. The trench 110T may come into contact with the side walls of the boundary element separation film 110a, as shown in FIG. 6A. That is, the core region CORE of the substrate 100 may be immediately adjacent to the fifth region A5 of the boundary element separation film 110a. However, this is merely an example, and the present invention is not limited thereto.

The trench 110T may not come into contact with the side walls of the boundary element separation film 110a, as shown in FIG. 6B. That is, the core region CORE of the substrate 100 may not be immediately adjacent to the fifth region A5 of the boundary element separation film 110a.

The boundary element separation film 110a may further include a six region A6. The fifth region A5 of the boundary element separation film 110a may be placed between the fourth region A4 of the boundary element separation film 110a and the sixth region A6 of the boundary element separation film 110a, and the height H4 of an upper side of the sixth region A6 of the boundary element separation film 110a may be higher than the height H5 of the upper side of the fifth region A5 of the boundary element separation film 110a. Here, the upper side of the sixth region A6 of the boundary element separation film 110a and the upper side of the fourth region A4 of the boundary element separation film 110a may have the same height H4, but the present invention is not limited thereto.

FIGS. 7 to 13 are intermediate stage diagrams for explaining a method of fabricating the semiconductor device according to an embodiment of the present invention.

Figure 7:
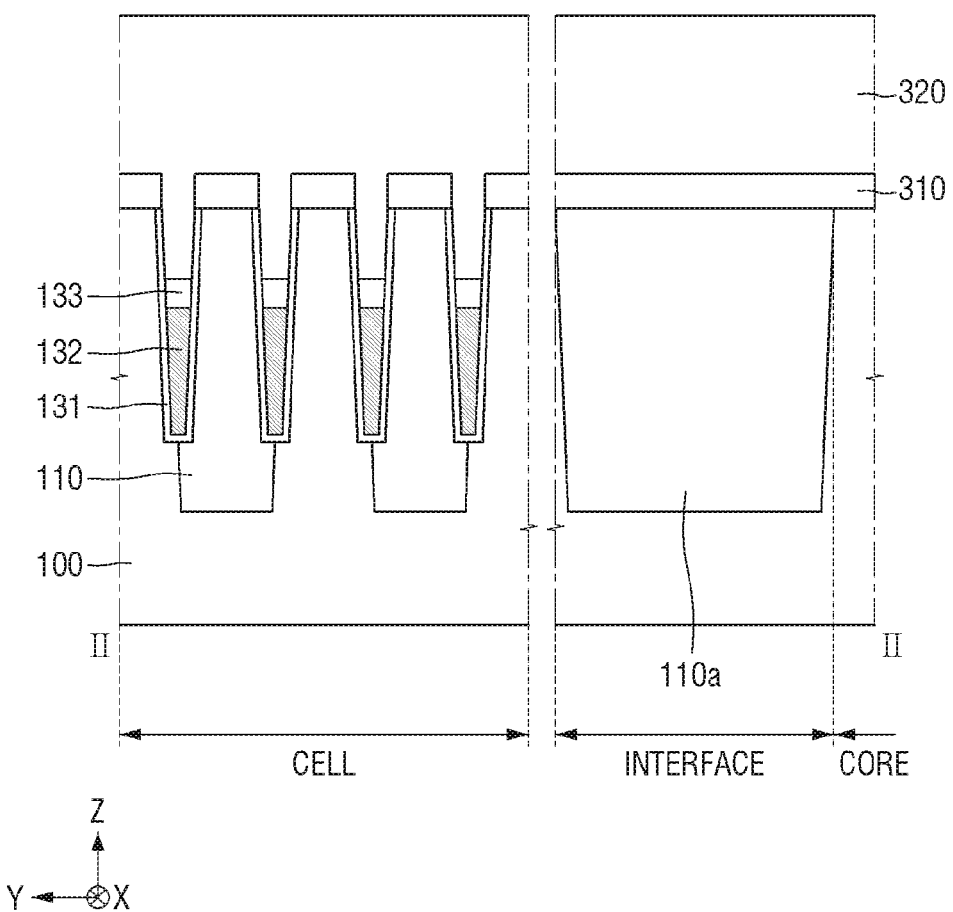
FIGS. 7 to 13 are intermediate stage diagrams for explaining a method of fabricating the semiconductor device according to an embodiment of the present invention.

Referring to FIG. 7, a part of the gate structure 130, the cell element separation film 110, and a boundary element separation film 110a may be formed on the substrate 100. For convenience of explanation, repeated parts of contents explained with reference to FIG. 4 will be omitted or simplified.

The gate structure 130 may be formed except for the second gate capping pattern (134 of FIG. 4). The second gate capping pattern 134 may be formed by a future process.

A first mask 310 may be formed on the substrate 100, the cell element separation film 110 and the boundary element separation film 110a. The first mask 310 may also be formed on the gate insulating film 131.

The first mask 310 may expose the first gate capping pattern 133.

A second mask 320 may be formed on the first mask 310 and the first gate capping pattern 133, and may fill a recessed region on the first gate capping pattern 133 exposed by the first mask 310.

Figure 8:
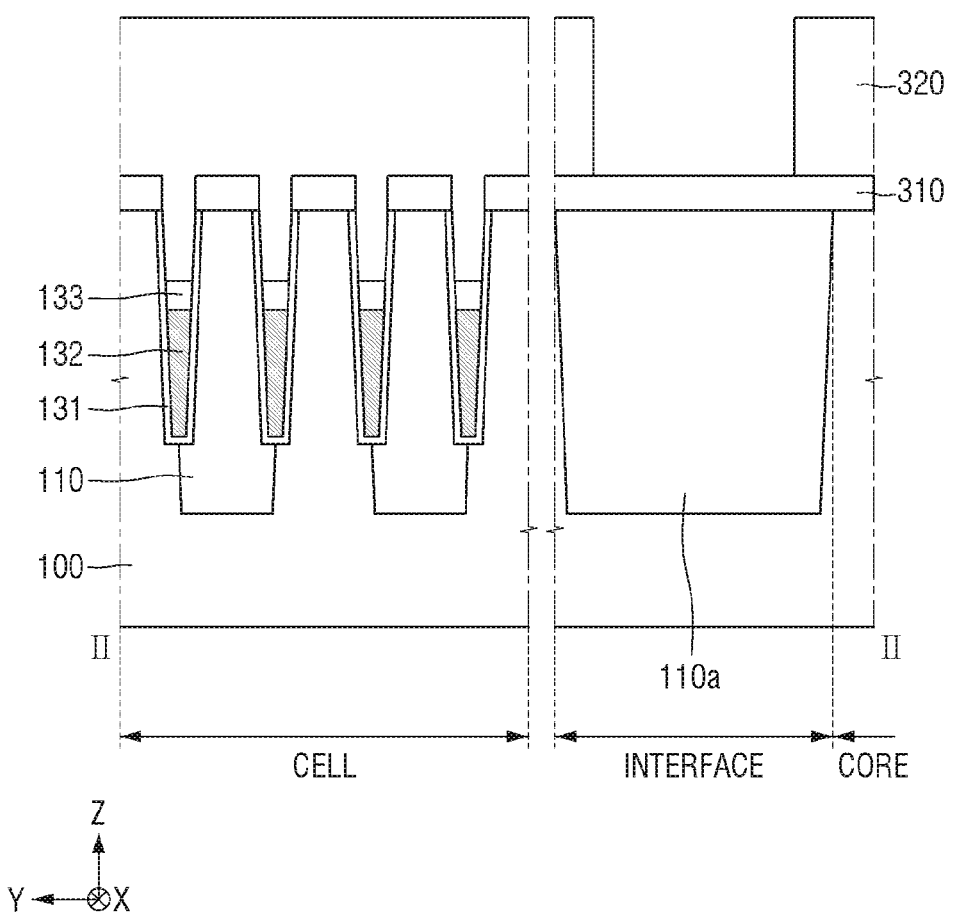
Figure 9:
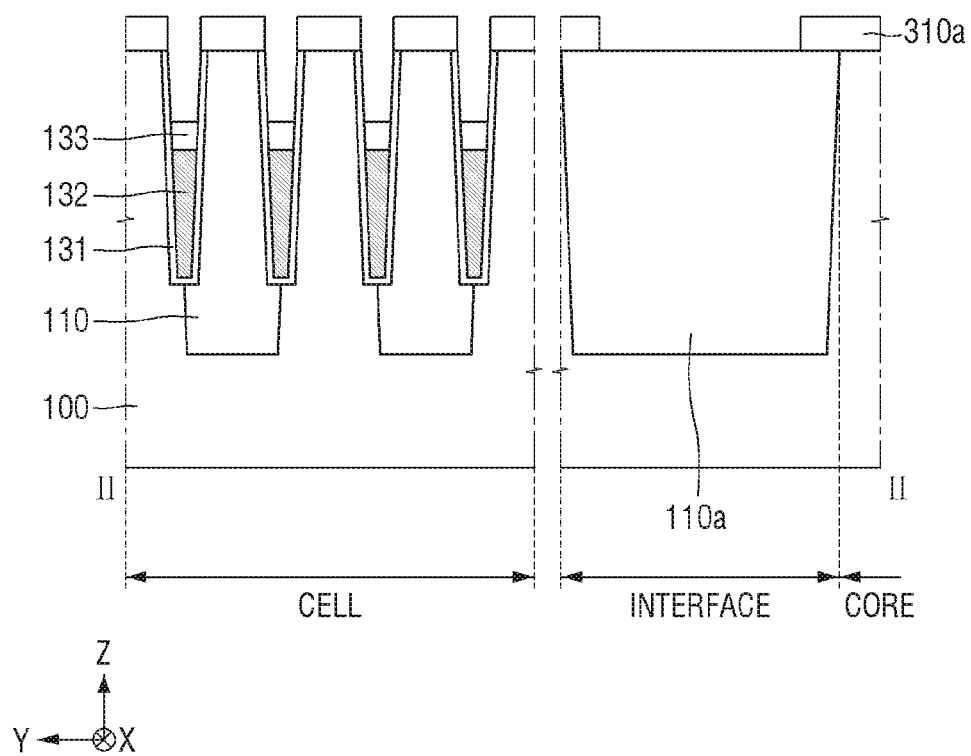

Referring to FIGS. 8 and 9, the second mask 320 may be partially etched. The etched second mask 320 may expose a part of the first mask 310 placed on the boundary element separation film 110a.

A part of the first mask 310 exposed by the second mask 320 may be etched using the second mask 320 as an etch mask. The etched first mask 310a may expose a part of the boundary element separation film 110a. The second mask 320 may then be removed.

Figure 10:
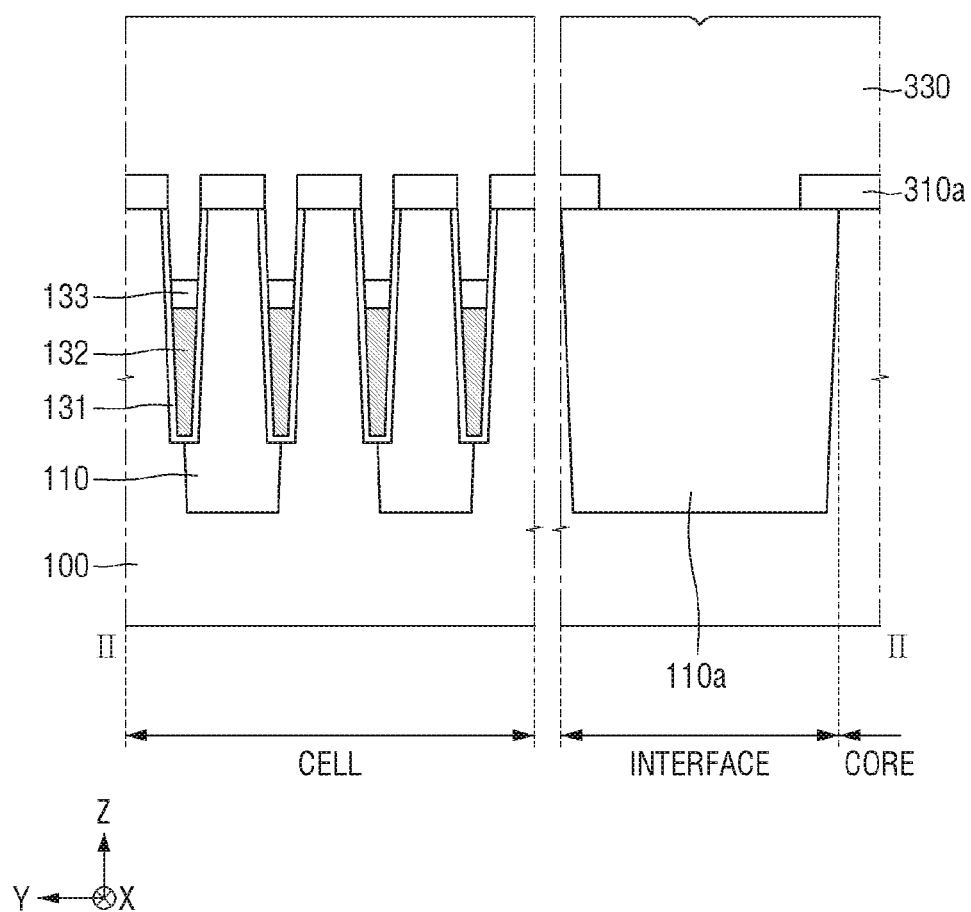
Figure 11:
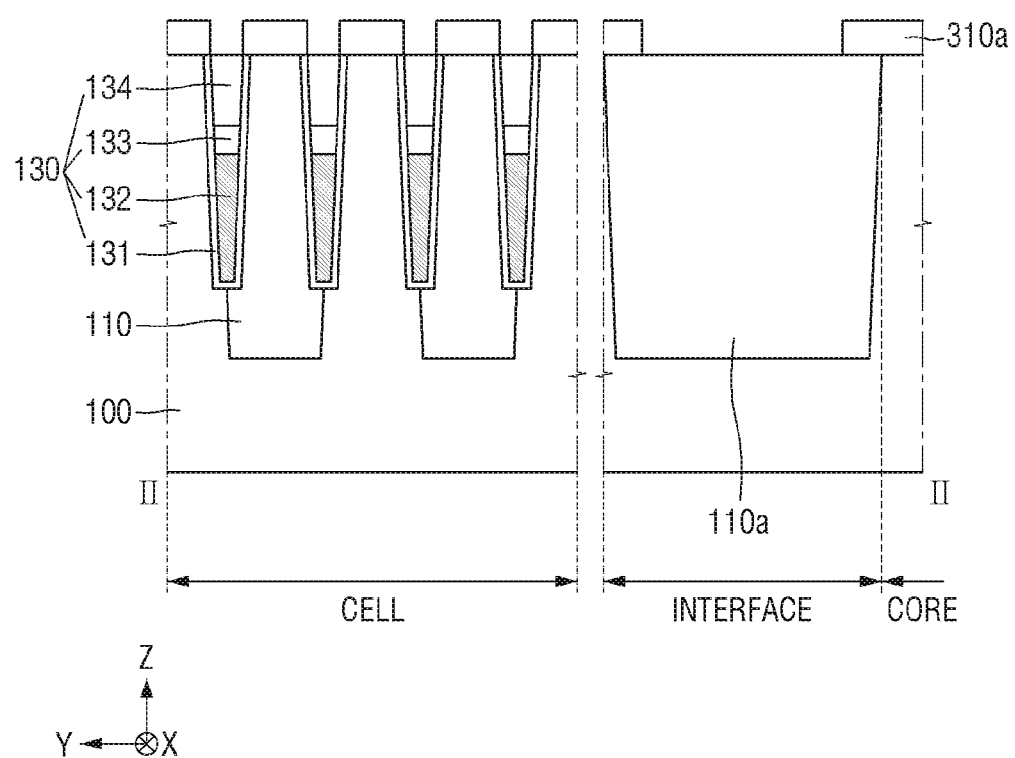

Referring to FIGS. 10 and 11, an insulating pattern 330 may be formed on the first mask 310a. The insulating pattern 330 may fill the recessed region on the first gate capping pattern 133 exposed by the first mask 310a, and the recessed region on the boundary element separation film 110a exposed by the first mask 310a.

Although FIG. 10 shows that the upper side of the insulating pattern 330 located above the boundary element separation film 110a has a groove, the present invention is not limited thereto. For example, the upper side of the insulating pattern 330 may be flat.

After that, the insulating pattern 330 may be removed except for a part placed on the first gate capping pattern 133. The part of the insulating pattern 330 placed on the first gate capping pattern 133 may correspond to the second gate capping pattern 134.

An upper side of the part of the insulating pattern 330 placed on the first gate capping pattern 133 may be placed on a plane the same as that of the upper side of the substrate 100, the upper side of the cell element separation film 110, and the upper side of the boundary element separation film 110a. For example, the upper side of the second gate capping pattern 134, the upper side of the substrate 100, the upper side of the cell element separation film 110, and the upper side of the boundary element separation film 110a may be placed on the same plane.

Figure 12:
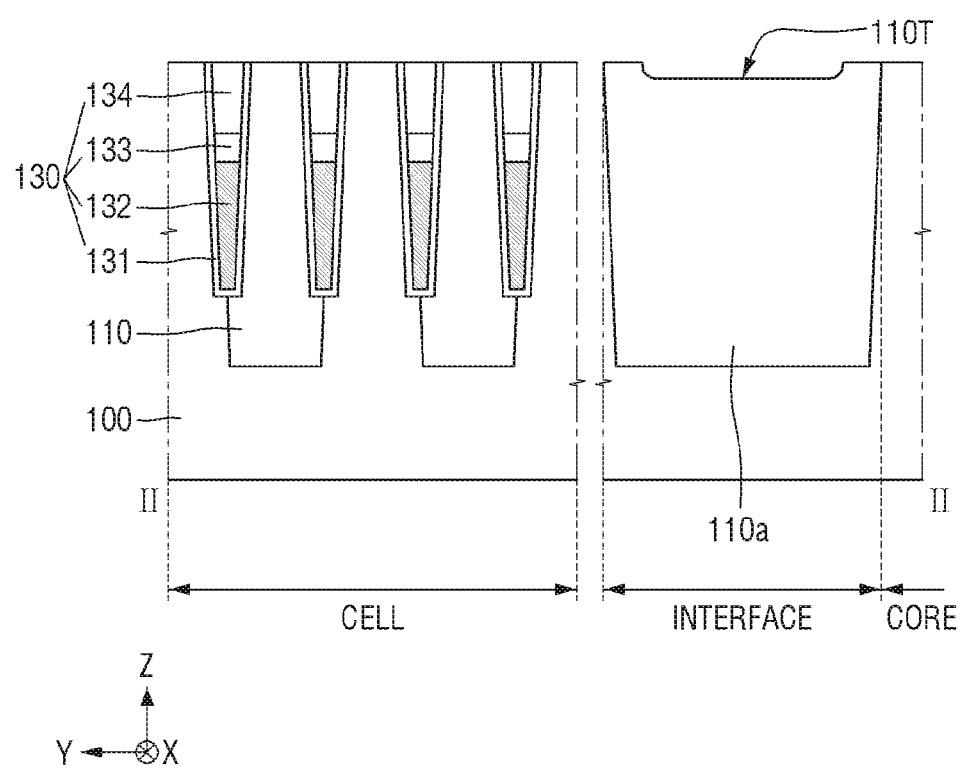
Figure 13:
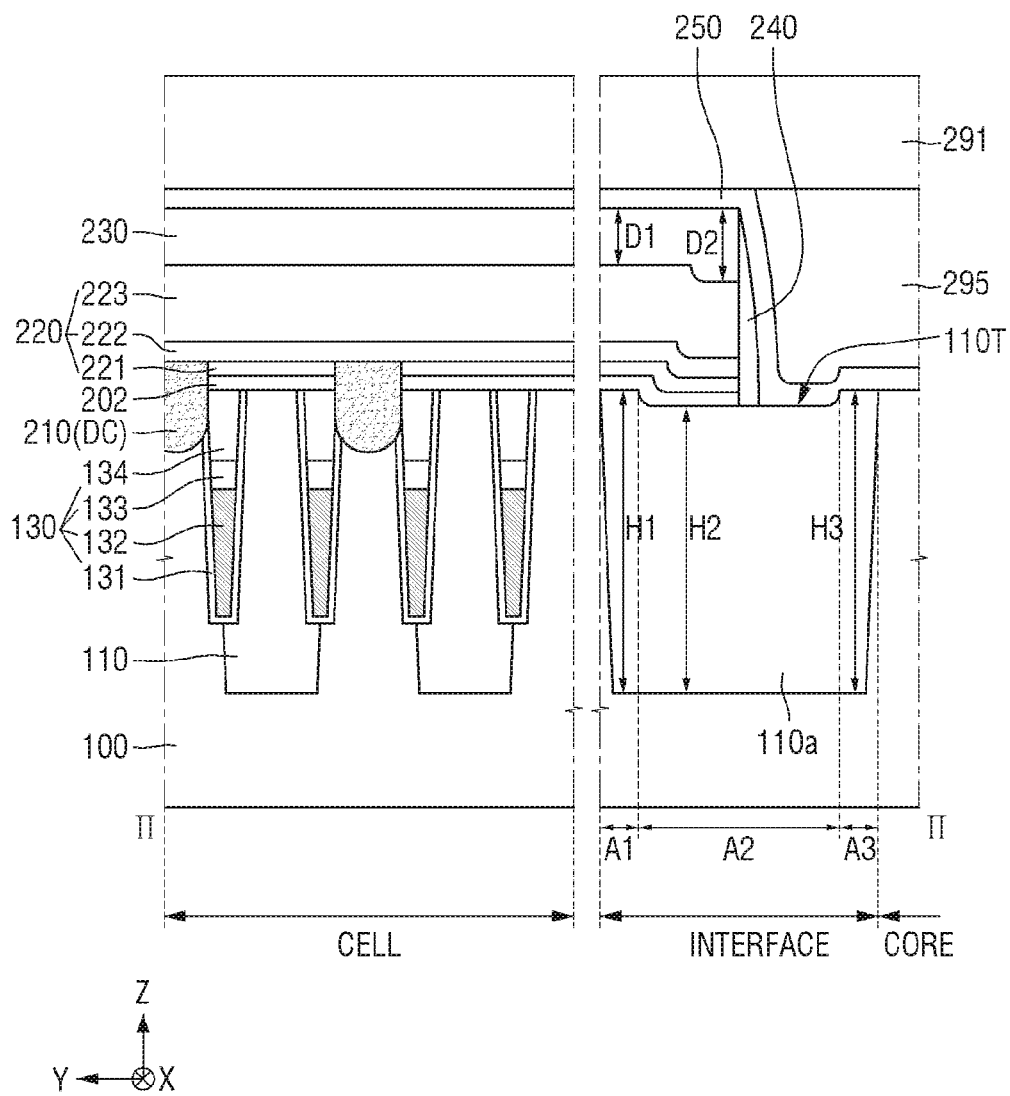

Referring to FIGS. 12 and 13, a part of the upper side of the boundary element separation film 110a exposed by the first mask 310a may be etched. For example, a part of the upper side of the boundary element separation film 110a may be etched to form a boundary element separation film trench 110T.

After that, the buffer layer 202 may be placed on the boundary element separation film trench 110T. The buffer layer 202 may extend along the profile of the upper side of the boundary element separation film 110a. Therefore, the buffer layer 202 may have a bent shape along the upper side of the boundary element separation film 110a.

A cell conductive line 220 may be placed on the buffer layer 202, and may extend along the profile of the upper side of the buffer layer 202. Therefore, since the buffer layer 202 has a bent shape, the cell conductive line 220 may have a bent shape along the upper side of the buffer layer 202. For example, the cell conductive line 220 may bend down to a lower level in an area inside and/or over the boundary element separation film trench 110T. However, the shape of the cell conductive line 220 is merely an example, and the present invention is not limited thereto. For example, although the lower side of the cell conductive line 220 has a bent shape along the upper side of the buffer layer 202, the upper side of the cell conductive line 220 may be flat.

FIGS. 14 to 18 are intermediate stage diagrams for explaining a method of fabricating the semiconductor device according to an embodiment of the present invention.

For convenience of explanation, the points different from those described with reference to FIGS. 7 to 13 will be mainly described.

Figure 14:
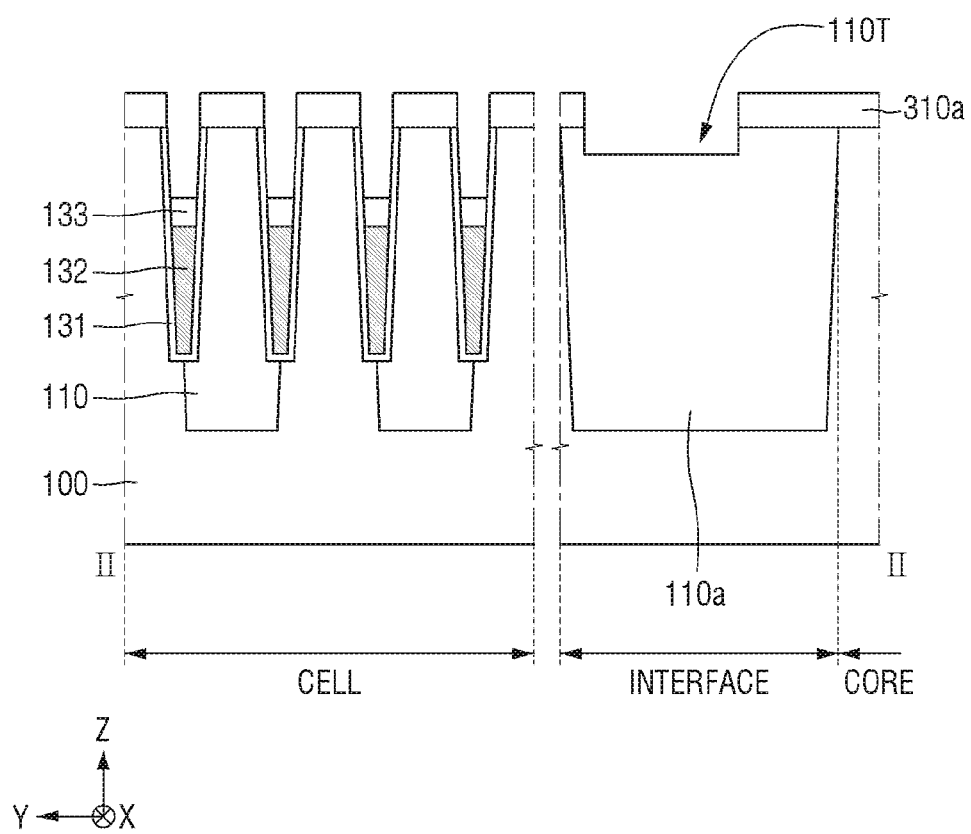
FIGS. 14 to 18 are intermediate stage diagrams for explaining a method of fabricating the semiconductor device according to an embodiment of the present invention.

For reference, FIG. 14 may be a drawing after a part of the first mask 310 is etched by FIGS. 7 and 8.

Referring to FIG. 14, a part of the boundary element separation film 110a may be etched at a position where a part of the first mask 310 is etched, as compared with FIG. 12. Also, the second gate capping pattern 134 is not formed yet, as compared with FIG. 12.

A part of the upper side of the boundary element separation film 110a may be etched to form the boundary element separation film trench 110T.

Figure 15:
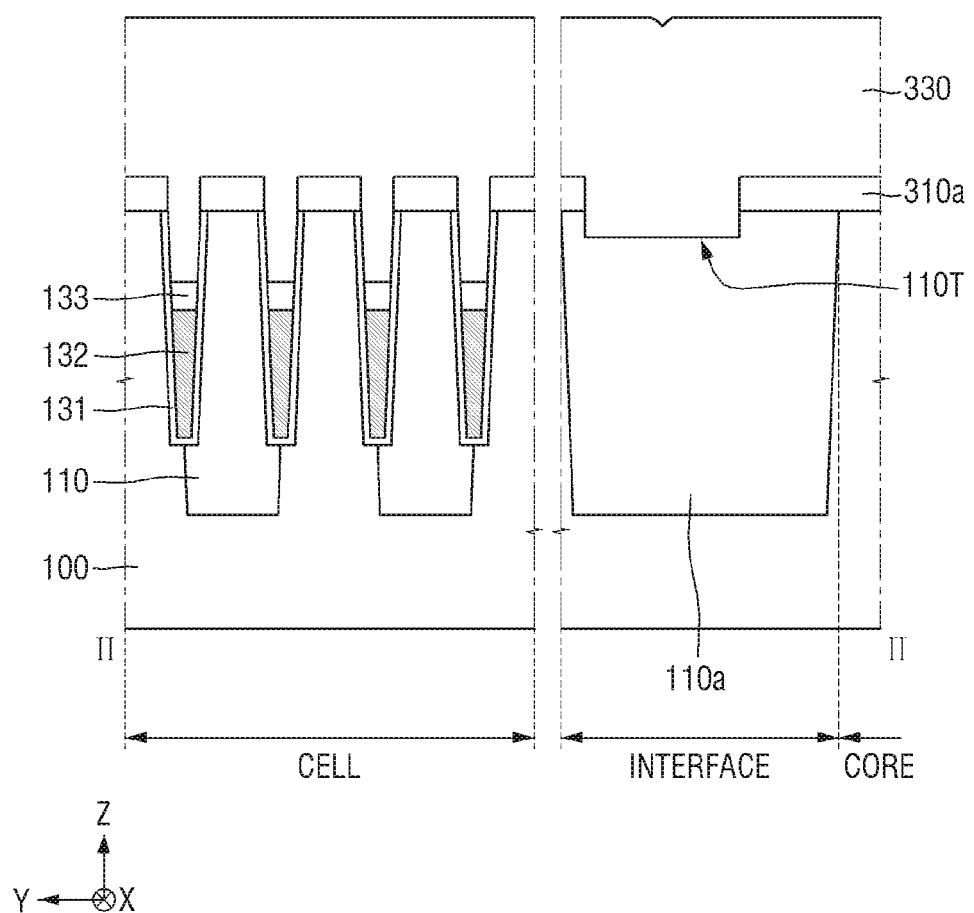
Figure 16A:
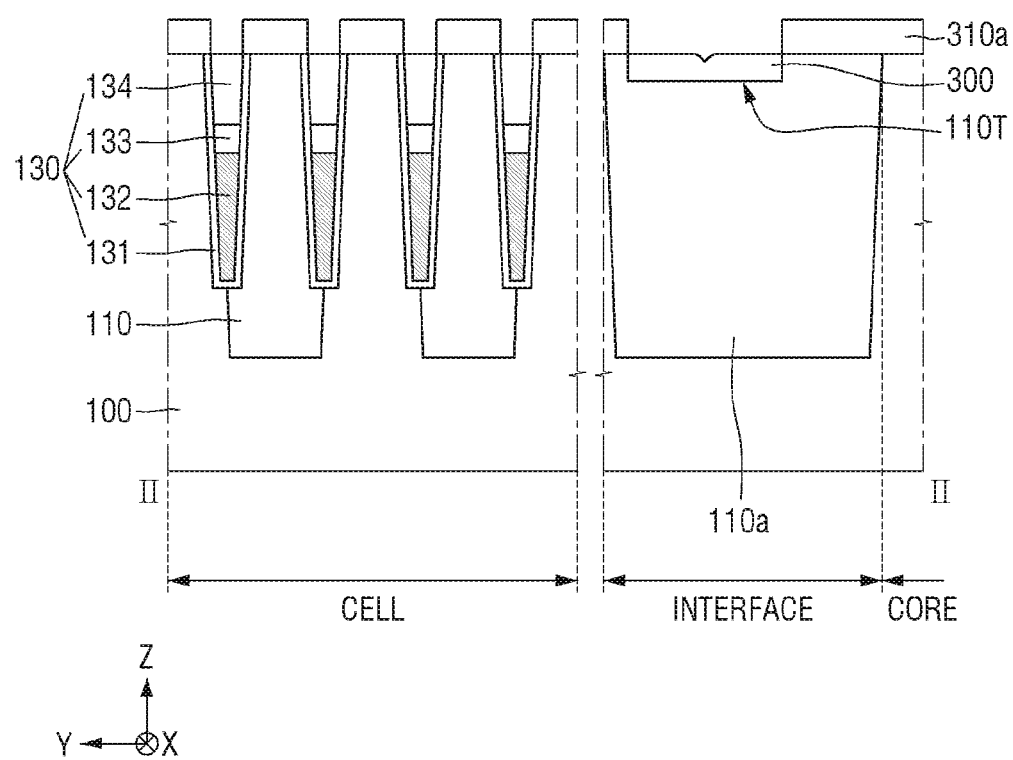
Figure 16B:
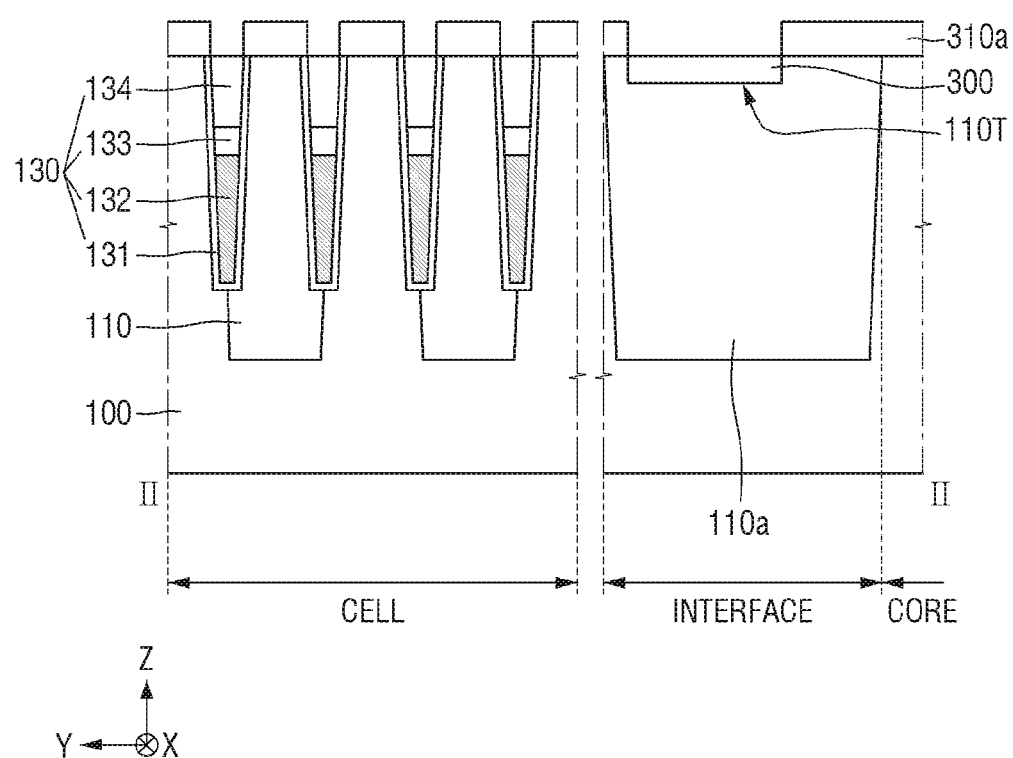

Referring to FIGS. 15 to 16B, an insulating pattern 330 may be formed on the first mask 310a. The insulating pattern 330 may fill the recessed region on the first gate capping pattern 133 exposed by the first mask 310a and the boundary element separation film trench 110T on the boundary element separation film 110a exposed by the first mask 310a.

After that, the insulating pattern 330 may be removed except for a part placed on the first gate capping pattern 133, and a part that fills the boundary element separation film trench 110T.

The part of the insulating pattern 330 placed on the first gate capping pattern 133 may correspond to the second gate capping pattern 134. The part of the insulating pattern 330 that fills the boundary element separation film trench 110T may correspond to the separation region capping film 300. Therefore, the separation region capping film 300 and the second gate capping pattern 134 may be formed of the same material.

The upper side of the second gate capping pattern 134 may be placed on a plane the same as that of the upper side of the substrate 100 and the upper side of the cell element separation film 110. The upper side of the separation region capping film 300 may be placed on a plane the same as that of the upper side of the substrate 100 and the upper side of the cell element separation film 110.

The upper side of the separation region capping film 300 may have a groove that is recessed in the third direction Z toward the substrate 100. However, this is merely an example, and the present invention is not limited thereto. For example, as shown in FIG. 16B, the upper side of the separation region capping film 300 may be flat.

Figure 17:
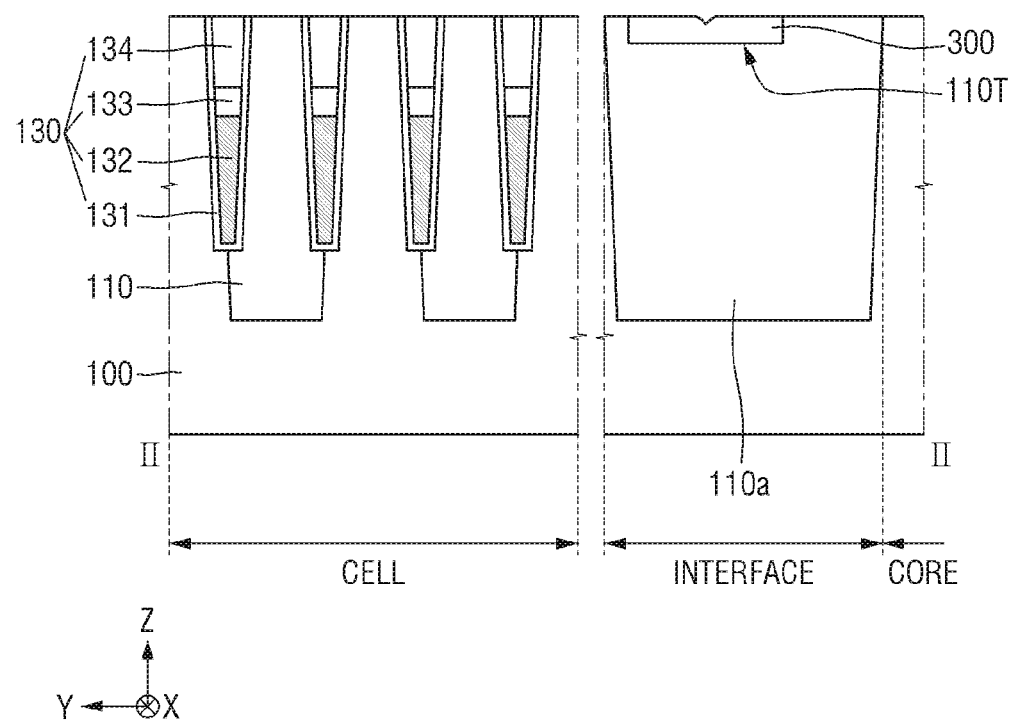

Referring to FIG. 17, the etched first mask 310a may be removed.

Figure 18:
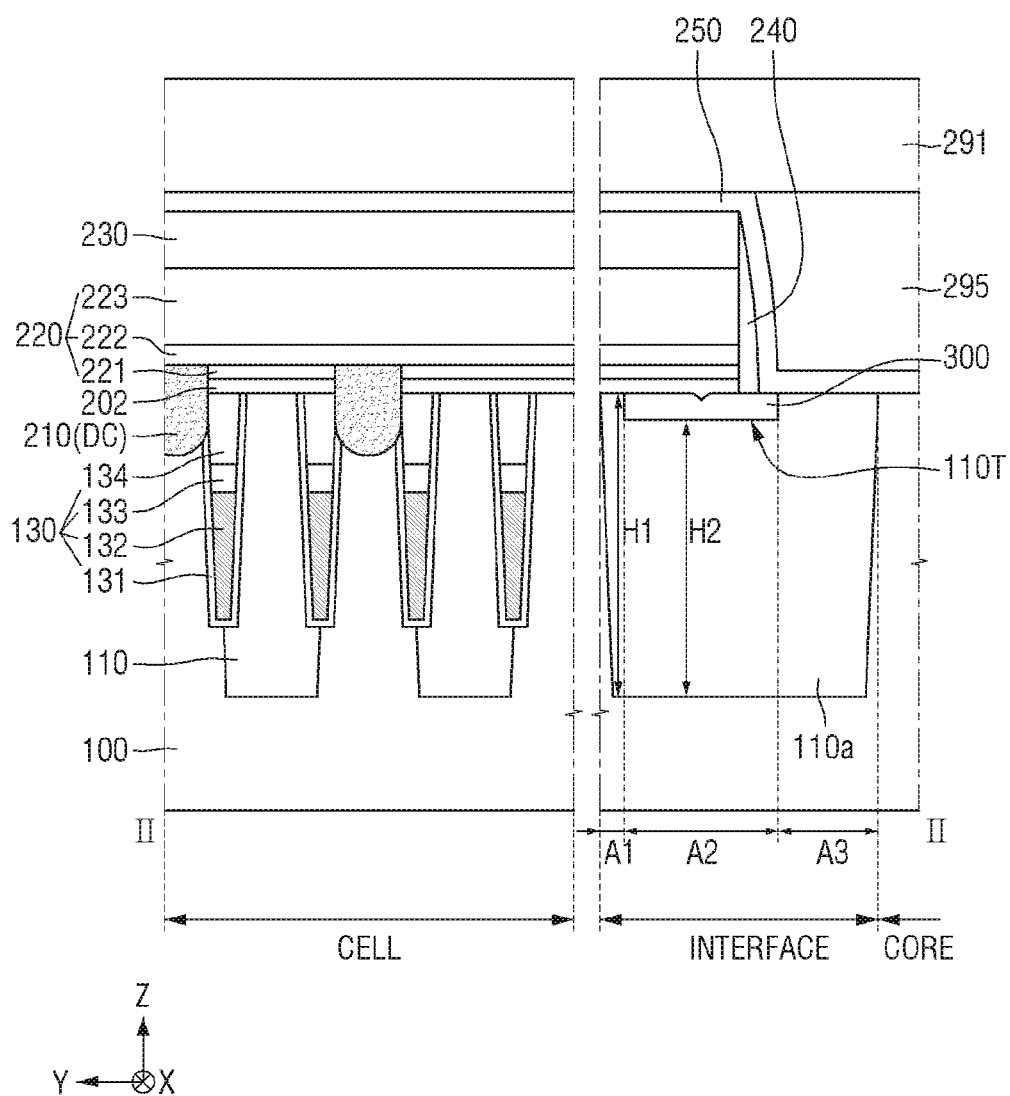

Referring to FIG. 18, the buffer layer 202 may be placed on the boundary element separation film 110a and the separation region capping film 300. The buffer layer 202 may extend along the profile of the upper side of the boundary element separation film 110a and the upper side of the separation region capping film 300.

A cell conductive line 220 may be placed on the buffer layer 202. The cell conductive line 220 may extend along the profile of the upper side of the buffer layer 202.

FIGS. 19 to 24 are intermediate stage diagrams for explaining a method of fabricating the semiconductor device according to an embodiment of the present invention.

For convenience of explanation, the points different from those described with reference to FIGS. 7 to 18 will be mainly described.

Figure 19:
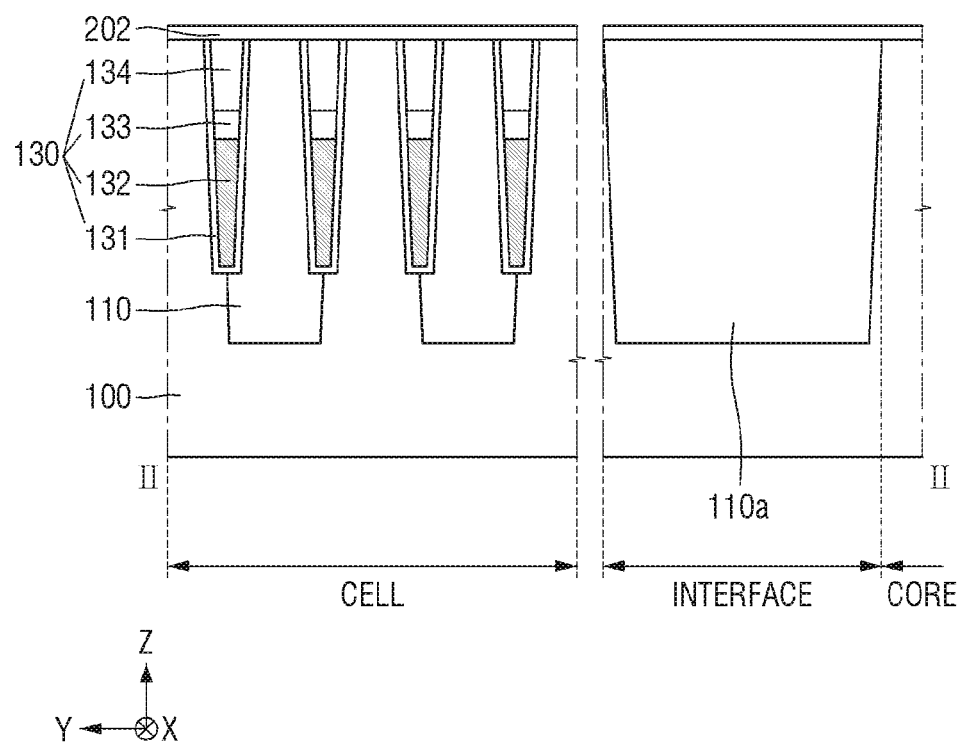
FIGS. 19 to 24 are intermediate stage diagrams for explaining a method of fabricating the semiconductor device according to an embodiment of the present invention.

For reference, FIG. 19 may be a diagram showing an intermediate step that is performed without etching a part of the boundary element separation film 110a in the processes of FIGS. 7 to 12.

Referring to FIG. 19, the buffer layer 202 may be formed on the substrate 100, the gate structure 130, the cell element separation film 110 and the boundary element separation film 110a, and may extend along the second direction Y.

Figure 20:
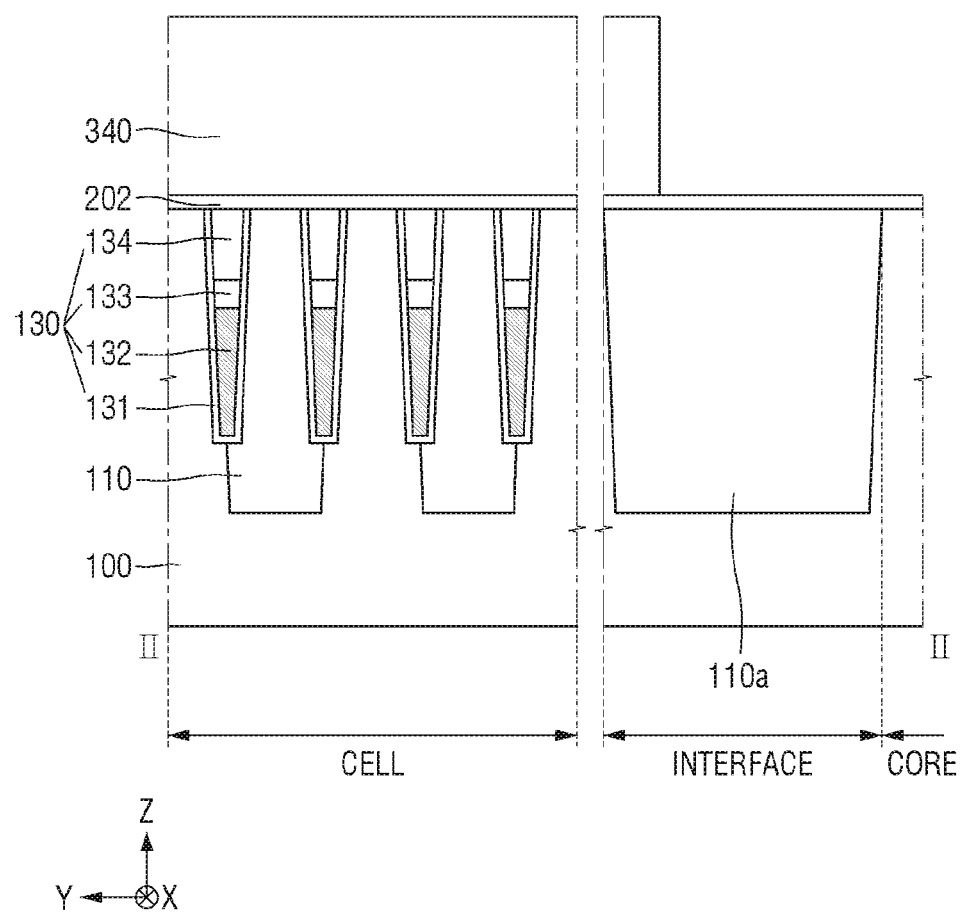

Referring to FIG. 20, a third mask 340 may be placed on the buffer layer 202. The third mask 340 may expose a part of the boundary element separation film 110a inside the boundary region INTERFACE.

Figure 21:
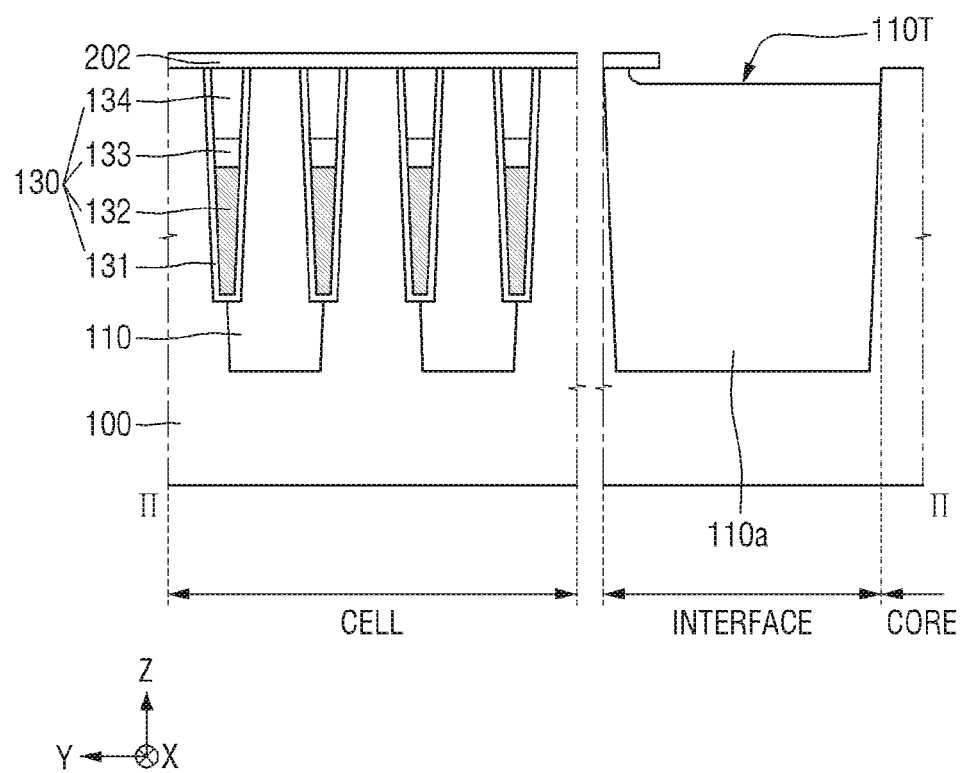
Figure 22:
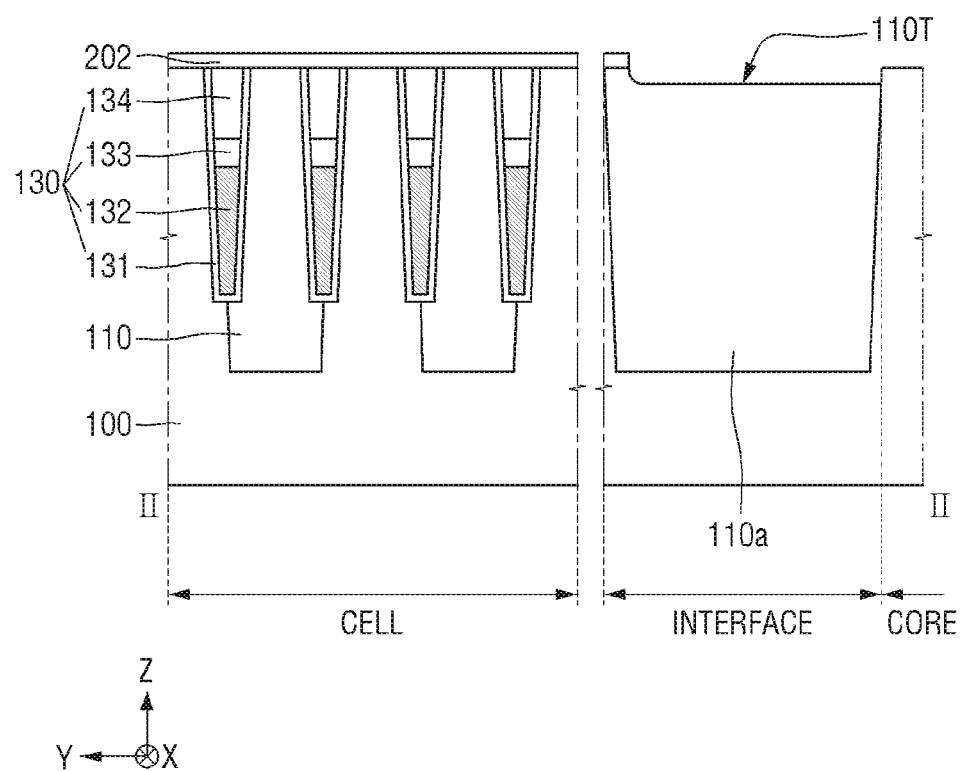

Referring to FIGS. 21 and 22, the buffer layer 202 exposed by the third mask 340 may be etched using the third mask 340 as an etch mask. The etching process may be performed, using a wet etching method. The etched buffer layer 202 may expose a part of the boundary element separation film 110a inside the boundary region INTERFACE.

At this time, a part of the boundary element separation film 110a may also be etched. A part of the upper side of the boundary element separation film 110a exposed by the buffer layer 202 may be etched. A part of the upper side of the boundary element separation film 110a under the buffer layer 202 may be further etched. Thus, the part of the boundary element separation film 110a etched may then form the boundary element separation film trench 110T.

Accordingly, the buffer layer 202 may have an overhanging portion protruding in the second direction Y, for example, protruding in a direction from the boundary element separation film 110a toward the core region CORE.

After that, the protruding portion of the buffer layer 202 may be etched.

However, the etching method of the buffer layer 202 is merely an example, and the present invention is not limited thereto.

The etching process of the buffer layer 202 may be performed, using a dry etching method instead of the wet etching process described above. In this case, a part of the upper side of the boundary element separation film 110a may not be further etched under the buffer layer 202. That is, the buffer layer 202 may not have an overhanging portion protruding from the boundary element separation film 110a in the second direction Y. Accordingly, after etching the buffer layer 202, the intermediate step of the form shown in FIG. 21 is omitted, and the intermediate step of the form shown in FIG. 22 may be immediately formed.

Figure 23:
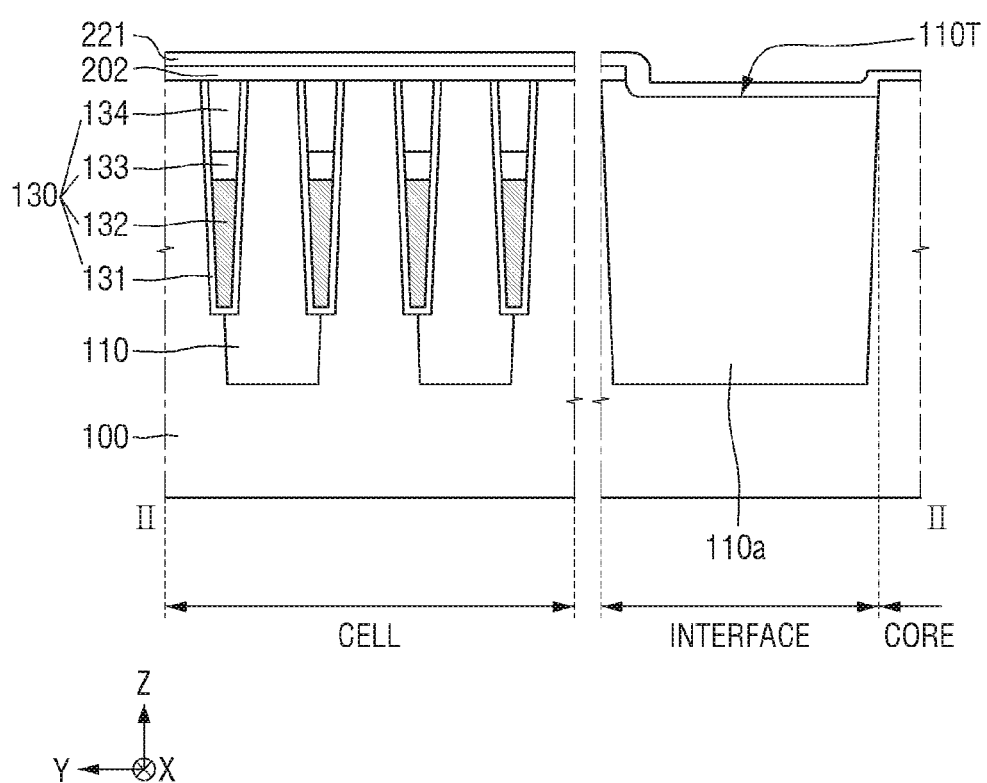

After that, a process of forming the bit line structure may be performed. For example, as shown in FIG. 23, the first cell conductive film 221 may be formed on the buffer layer 202 and the boundary element separation film 110a.

Since the first cell conductive film 221 extends along the upper side of the buffer layer 202 and the upper side of the boundary element separation film 110a, the first cell conductive film 221 may have a bent shape.

Figure 24:
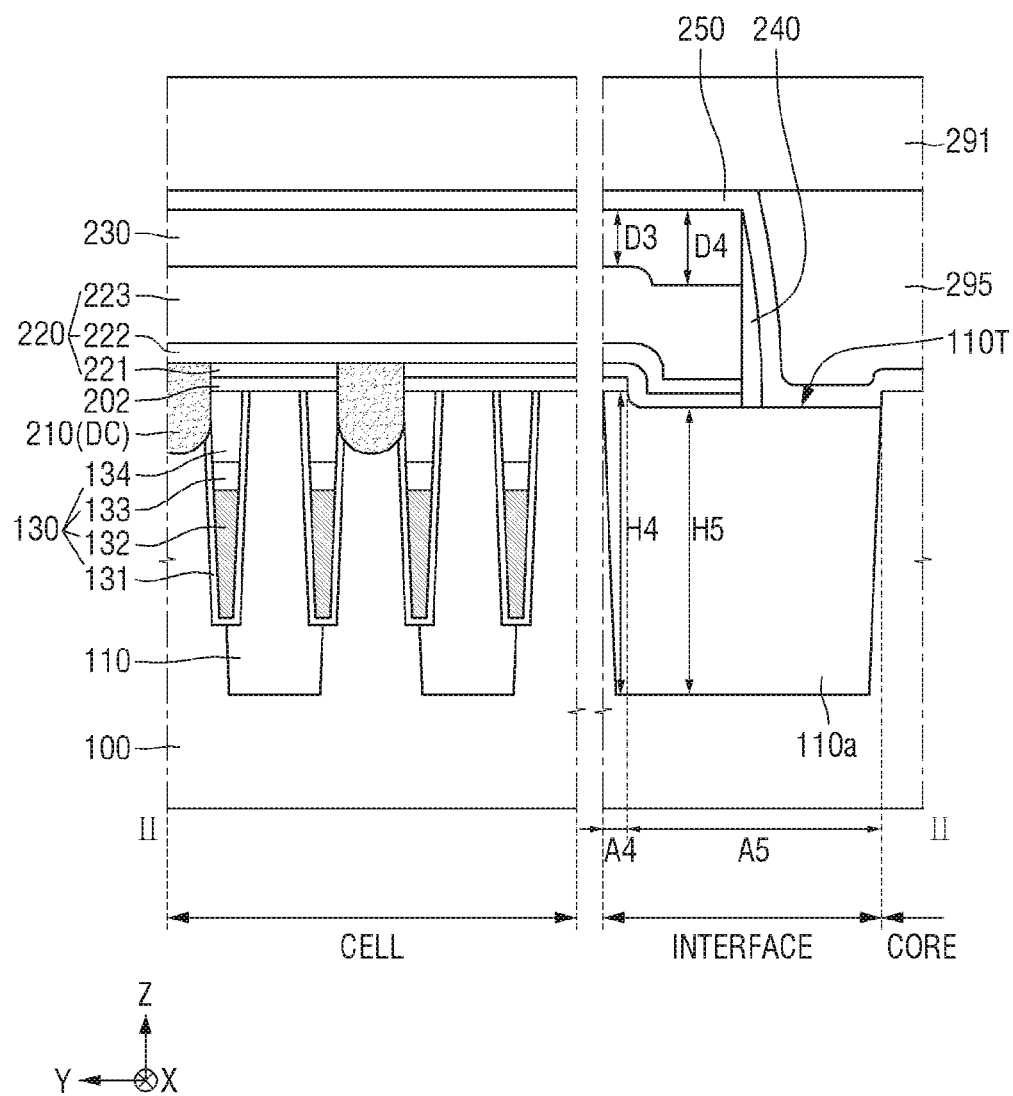

Referring to FIG. 24, the second cell conductive film 222 and the third cell conductive film 223 may be sequentially formed on the first cell conductive film 221.

The second cell conductive film 222 and the third cell conductive film 223 may extend along the profile of the upper side of the first cell conductive film 221. Therefore, since the first cell conductive film 221 has a bent shape, the second cell conductive film 222 and the third cell conductive film 223 may also have a bent shape. That is, the cell conductive line 220 may have a bent shape. For example, the cell conductive line 220 may bend down to a lower level in an area inside and/or over the boundary element separation film trench 110T.

Further, the cell line capping film 230 may be formed on the cell conductive line 220.

The cell conductive line 220 and the cell line capping film 230 may be partially etched. For example, the cell conductive line 220 and the cell line capping film 230 on the fifth region A5 may be partially etched.

The cell line spacer 240 and the second etching stop film 250 may be formed at a position where the cell conductive line 220 and the cell line capping film 230 are etched.

The cell line spacer 240 may be formed on the side walls of the buffer layer 202, the cell conductive line 220, and the cell line capping film 230. The second etching stop film 250 may be formed along the profile of the cell line capping film 230 and the profile of the cell line spacer 240. In addition, the second etching stop film 250 may also be formed along the profile of top surfaces of the boundary element separation film 110a and the substrate 100 not covered by the cell line spacer 240 and the first cell conductive film 221 in the boundary region INTERFACE and the core region CORE.

The cell interlayer insulating film 295 may be formed on the side walls of the bit line structure. For example, the cell interlayer insulating film 295 may be placed on the second etching stop film 250. The insertion interlayer insulating film 291 may be formed on the bit line structure and the cell interlayer insulating film 295.

In concluding the detailed description, those skilled in the art will appreciate that many variations and modifications may be made to the specific embodiments set forth herein without departing from the spirit and scope of the present invention. Therefore, the disclosed embodiments of the present invention are used in a generic and descriptive sense only and not for purposes of limitation.

What is claimed is:

1. A semiconductor device comprising:
   a substrate which includes a cell region and a core region;
   a boundary element separation film which is placed inside the substrate, and separates the cell region and the core region;
   a bit line which is placed on the cell region and the boundary element separation film and extends along a first direction; and
   a bit line capping film which extends along the first direction, and contacts an upper side of the bit line on the bit line,
   wherein the boundary element separation film includes a first region and a second region,
   a height of an upper side of the first region of the boundary element separation film is different from a height of an upper side of the second region of the boundary element separation film, on a basis of a bottom side of the boundary element separation film,
   the bit line is placed over the first region of the boundary element separation film and the second region of the boundary element separation film, and
   a thickness of the bit line capping film in the first region of the boundary element separation film is smaller than a thickness of the bit line capping film in the second region of the boundary element separation film.

2. The semiconductor device of claim 1, wherein the first region of the boundary element separation film is nearer to the cell region than the second region of the boundary element separation film, and
   the height of the upper side of the first region of the boundary element separation film is higher than the height of the upper side of the second region of the boundary element separation film.

3. The semiconductor device of claim 2, wherein the boundary element separation film further includes a third region,
   the second region of the boundary element separation film is placed between the first region of the boundary element separation film and the third region of the boundary element separation film, and
   a height of an upper side of the third region of the boundary element separation film is higher than the height of the upper side of the second region of the boundary element separation film, on the basis of the bottom side of the boundary element separation film.

4. The semiconductor device of claim 1, wherein the core region of the substrate is immediately adjacent to the second region of the boundary element separation film.

5. The semiconductor device of claim 1, further comprising:
   a separation region capping film which is placed on the second region of the boundary element separation film,
   wherein the separation region capping film does not extend to the first region of the boundary element separation film.

6. The semiconductor device of claim 1, wherein an upper side of the bit line capping film in the first region and an upper side of the bit line capping film in the second region are placed on a same plane.

7. The semiconductor device of claim 1, further comprising:
   a buffer layer extending along the first direction, below the bit line,
   wherein on the boundary element separation film, the buffer layer extends along profiles of the upper side of the first region and the upper side of the second region of the boundary element separation film.

8. A semiconductor device comprising:
   a substrate which includes a cell region and a core region;
   a boundary element separation film which is placed inside the substrate, separates the cell region and the core region, and includes a first region and a second region;
   a bit line structure which is placed on the cell region and the boundary element separation film, and includes a bit line extending along a first direction and a bit line capping film placed on the bit line, the bit line being formed of a conductive material;
   a gate electrode which is placed inside the substrate of the cell region and intersects the bit line; and
   a buffer layer which is placed on the boundary element separation film and the cell region, and extends along the first direction,
   wherein the bit line is placed over the first region of the boundary element separation film and the second region of the boundary element separation film,
   the buffer layer is placed between the boundary element separation film and the bit line on the first region of the boundary element separation film, and is not placed on the second region of the boundary element separation film, and
   a lower side of the bit line comes into contact with an upper side of the buffer layer in the first region and comes into contact with an upper side of the boundary element separation film in the second region.

9. The semiconductor device of claim 8, wherein a height of an upper side of the first region of the boundary element separation film is different from a height of the upper side of the second region of the boundary element separation film, on a basis of a bottom side of the boundary element separation film.

10. The semiconductor device of claim 8, wherein the bit line capping film extends along the first direction on the bit line, and
   a thickness of the bit line capping film in the first region of the boundary element separation film is smaller than a thickness of the bit line capping film in the second region of the boundary element separation film.

11. The semiconductor device of claim 10, wherein an upper side of the bit line capping film in the first region and an upper side of the bit line capping film in the second region are placed on a same plane.

12. The semiconductor device of claim 8, wherein the first region of the boundary element separation film is nearer to the cell region than the second region of the boundary element separation film.

13. The semiconductor device of claim 8, wherein the boundary element separation film further includes a third region,
- the second region of the boundary element separation film is placed between the first region of the boundary element separation film and the third region of the boundary element separation film, and
- a height of an upper side of the third region of the boundary element separation film is higher than a height of an upper side of the second region of the boundary element separation film.

14. The semiconductor device of claim 8, wherein the core region of the substrate is immediately adjacent to the second region of the boundary element separation film.

* * * * *